US012614514B2

(12) United States Patent
Kim et al.

(10) Patent No.: US 12,614,514 B2
(45) Date of Patent: Apr. 28, 2026

(54) DISPLAY APPARATUS

(71) Applicant: Samsung Display Co., Ltd., Yongin-si (KR)

(72) Inventors: Myeongeon Kim, Yongin-si (KR); Dongeup Lee, Yongin-si (KR); Youngsoo Yoon, Yongin-si (KR); Haeyeon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/614,532

(22) Filed: Mar. 22, 2024

(65) Prior Publication Data

US 2024/0321210 A1     Sep. 26, 2024

(30) Foreign Application Priority Data

Mar. 24, 2023   (KR) ........................ 10-2023-0039116
Jun. 2, 2023   (KR) ........................ 10-2023-0071897

(51) Int. Cl.
*G09G 3/3233*      (2016.01)
*H10K 59/121*      (2023.01)
*H10K 59/131*      (2023.01)

(52) U.S. Cl.
CPC ......... *G09G 3/3233* (2013.01); *H10K 59/121* (2023.02); *H10K 59/131* (2023.02); *G09G 2300/0426* (2013.01); *G09G 2300/0842* (2013.01)

(58) Field of Classification Search
CPC ......... G09G 3/3233; G09G 2300/0426; G09G 2300/0842; H10K 59/121; H10K 59/131
See application file for complete search history.

(56) References Cited

U.S. PATENT DOCUMENTS

| | | | |
|---|---|---|---|
| 2012/0161197 A1 | 6/2012 | Im et al. | |
| 2019/0245020 A1* | 8/2019 | Choi | ........................ H01L 21/28 |
| 2020/0411625 A1* | 12/2020 | Seo | ..................... G02F 1/13452 |
| 2021/0233455 A1* | 7/2021 | Yang | .................... G09G 3/2003 |
| 2022/0045159 A1* | 2/2022 | Lee | ....................... H10K 59/121 |
| 2022/0085123 A1 | 3/2022 | Baek et al. | |

(Continued)

FOREIGN PATENT DOCUMENTS

| | | |
|---|---|---|
| CN | 115516640 A | 12/2022 |
| KR | 10-1174884 B1 | 8/2012 |

(Continued)

*Primary Examiner* — Priyank J Shah
(74) *Attorney, Agent, or Firm* — Womble Bond Dickinson (US) LLP

(57) ABSTRACT

A display apparatus includes a first sub-pixel group arranged along a first imaginary line in a plan view, a second sub-pixel group arranged along a second imaginary line in a plan view, a portion of the second imaginary line being arranged in a component area, a data driver arranged in a peripheral area and configured to output a dataset including one of a first color data signal or a second color data signal, a data distributor configured to transmit the dataset received from the data driver to the first sub-pixel group and the second sub-pixel group, and data lines configured to connect the data distributor to the first sub-pixel group and the second sub-pixel group. The data distributor is further configured to alternately transmit the first color data signal to the data lines.

26 Claims, 12 Drawing Sheets

(56) References Cited

U.S. PATENT DOCUMENTS

| 2022/0285475 | A1 | | 9/2022 | Hong et al. | |
|---|---|---|---|---|---|
| 2022/0310709 | A1 | | 9/2022 | Zhang et al. | |
| 2022/0328600 | A1 | * | 10/2022 | Dong | H10K 59/1216 |
| 2023/0129729 | A1 | * | 4/2023 | Huang | H10K 59/121 |
| | | | | | 257/40 |
| 2024/0040867 | A1 | | 2/2024 | Bang et al. | |

FOREIGN PATENT DOCUMENTS

| KR | 10-2022-0036437 A | 3/2022 |
|---|---|---|
| KR | 10-2022-0125865 A | 9/2022 |
| KR | 10-2024-0017302 A | 2/2024 |

* cited by examiner

DISPLAY APPARATUS

CROSS-REFERENCE TO RELATED APPLICATIONS

The present application claims priority to and the benefit of Korean Patent Application No. 10-2023-0039116, filed on Mar. 24, 2023, and Korean Patent Application No. 10-2023-0071897, filed on Jun. 2, 2023, in the Korean Intellectual Property Office, the entire disclosures of both of which are incorporated by reference herein.

BACKGROUND

1. Field

One or more embodiments relate to a display apparatus.

2. Description of Related Art

Display apparatuses are configured to receive information about images and to display the images. Display apparatuses may be used as displays for small products such as mobile phones or large products such as televisions.

A display apparatus includes a plurality of pixels configured to receive electrical signals and to emit light so as to display images to the outside. Each of the pixels includes a light-emitting element. For example, in the case of an organic light-emitting display apparatus, an organic light-emitting diode is included as the light-emitting element. In general, an organic light-emitting display apparatus includes a thin-film transistor and an organic light-emitting diode on a substrate. The organic light-emitting diode operates to emit light on its own.

SUMMARY

In order to improve image quality and energy efficiency of the display apparatuses, it may be desirable to reduce or minimize interference of other signals affecting data signals. One or more embodiments include a display apparatus in which data signal interference is reduced or minimized. However, this is only an example and the scope of the present disclosure is not limited thereby.

Additional aspects will be set forth in part in the description which follows and, in part, will be apparent from the description, or may be learned by practice of the presented embodiments of the present disclosure.

According to one or more embodiments, a display apparatus includes a substrate including a component area, a display area around the component area, and a peripheral area outside the display area, a first sub-pixel group on the substrate and arranged along a first imaginary line in a plan view, a second sub-pixel group on the substrate and arranged along a second imaginary line parallel to the first imaginary line in a plan view, a portion of the second imaginary line being arranged in the component area in a plan view, a third sub-pixel group on the substrate and arranged along a third imaginary line parallel to the second imaginary line in a plan view, a portion of the third imaginary line being arranged in the component area in a plan view and the second imaginary line being between the first imaginary line and the third imaginary line in a plan view, a data driver arranged in the peripheral area and configured to output a dataset including one of a first color data signal or a second color data signal, a data distributor configured to transmit the dataset received from the data driver to the first sub-pixel group, the second sub-pixel group, and the third sub-pixel group, a first data line configured to connect the data distributor to the first sub-pixel group, a second data line configured to connect the data distributor to the second sub-pixel group, and a third data line configured to connect the data distributor to the third sub-pixel group, wherein the data distributor is further configured to alternately transmit the first color data signal to the first data line and the third data line.

The data distributor may include a first-first switch configured to transmit the first color data signal to the first data line, and a first-second switch configured to transmit the first color data signal to the third data line.

The display apparatus may further include a controller configured to generate a control signal for controlling an on/off operation of each of the first-first switch and the first-second switch, and a control signal line configured to transmit the control signal from the controller to the first-first switch and the first-second switch.

The controller may be further configured to generate a first control signal for the on/off operation of the first-first switch and a second control signal for the on/off operation of the first-second switch.

The control signal line may include a first control signal line configured to transmit the first control signal from the controller to the first-first switch, and a second control signal line configured to transmit the second control signal from the controller to the first-second switch.

The data distributor may be between the display area and the data driver in the peripheral area.

The first imaginary line may be spaced from the component area in a plan view.

The second sub-pixel group may be configured to receive the second color data signal through the second data line.

The second sub-pixel group may include a second-first sub-pixel and a second-second sub-pixel, the second-first sub-pixel may be on one side of the component area in a plan view, and the second-second sub-pixel may be on another side of the component area in a plan view.

A position of the second-first sub-pixel and a position of the second-second sub-pixel may be symmetrical with each other with respect to an imaginary center line that passes through a center of the component area in a plan view and crosses the first to third imaginary lines.

The display apparatus may further include a fourth sub-pixel group on the substrate and arranged along a fourth imaginary line parallel to the third imaginary line in a plan view, a portion of the fourth imaginary line being arranged in the component area in a plan view and the third imaginary line being between the second imaginary line and the fourth imaginary line in a plan view, and a fourth data line configured to transmit the data signal to the fourth sub-pixel group.

The data distributor may be further configured to transmit the second color data signal to the second data line and the fourth data line.

The data distributor may further include a first-third switch configured to transmit the second color data signal to the second data line, and a first-fourth switch configured to transmit the second color data signal to the fourth data line.

The controller may be further configured to control an on/off operation of the first-third switch by using the first control signal and to control an on/off operation of the first-fourth switch by using the second control signal.

The first control signal line may be connected to the first-first switch and the first-third switch, and the second control signal line may be connected to the first-second switch and the first-fourth switch.

The peripheral area may include a first area in which the data driver is located, and a second area located on an opposite side of the first area with respect to the display area.

In a plan view, the second data line may include a second-first sub-line configured to electrically connect the second-first sub-pixel to the data distributor and extending toward the first area with respect to the second-first sub-pixel, a second-second sub-line extending toward the second area with respect to the second-first sub-pixel and electrically connected to the second-first sub-line, a second-third sub-line arranged in the second area, extending in a direction crossing the first to third imaginary lines, and electrically connected to the second-second sub-line, and a second-fourth sub-line configured to electrically connect the second-third sub-line to the second-second sub-pixel and extending toward the second-second sub-pixel in the second area.

The third sub-pixel group may include a third-first sub-pixel and a third-second sub-pixel, the third-first sub-pixel may be on one side of the component area in a plan view, and the third-second sub-pixel may be on another side of the component area in a plan view.

A position of the third-first sub-pixel and a position of the third-second sub-pixel may be symmetrical with each other with respect to an imaginary center line that passes through a center of the component area in a plan view and crosses the first to third imaginary lines.

In a plan view, the third data line may include a third-first sub-line configured to electrically connect the third-first sub-pixel to the data distributor and extending toward the first area with respect to the third-first sub-pixel, a third-second sub-line extending toward the second area with respect to the third-first sub-pixel and electrically connected to the third-first sub-line, a third-third sub-line arranged in the second area, extending in a direction crossing the first to third imaginary lines, and electrically connected to the third-second sub-line, and a third-fourth sub-line configured to electrically connect the third-third sub-line to the third-second sub-pixel and extending toward the third-second sub-pixel in the second area.

In a plan view, a length of the second-second sub-line may be greater than a length of the third-second sub-line.

In a plan view, a length of the second-third sub-line may be greater than a length of the third-third sub-line.

In a plan view, a length of the second-fourth sub-line may be greater than a length of the third-fourth sub-line.

According to one or more embodiments, a display apparatus includes a substrate including a component area, a display area around the component area, and a peripheral area outside the display area, a plurality of first sub-pixels on the substrate and arranged along a first imaginary line in a plan view, a plurality of second sub-pixels on the substrate and arranged along a second imaginary line parallel to the first imaginary line in a plan view, a plurality of third sub-pixels on the substrate and arranged along a third imaginary line parallel to the second imaginary line in a plan view, a portion of the third imaginary line being arranged in the component area in a plan view and the second imaginary line being between the first imaginary line and the third imaginary line in a plan view, a data driver arranged in the peripheral area and configured to output a dataset including one of a first color data signal or a second color data signal, a data distributor configured to transmit the dataset received from the data driver to the plurality of first sub-pixels, the plurality of second sub-pixels, and the plurality of third sub-pixels, a first line configured to transmit the first color data signal from the data distributor to the plurality of first sub-pixels, a second line configured to transmit the first color data signal from the data distributor to the plurality of second sub-pixels, a third line configured to transmit the first color data signal from the data distributor to the plurality of third sub-pixels, and in a plan view, a portion of the third line is between the first line and the second line.

The display apparatus may further include a plurality of fourth sub-pixels on the substrate and arranged along a fourth imaginary line parallel to the third imaginary line in a plan view, a portion of the fourth imaginary line being arranged in the component area in a plan view and the third imaginary line being between the second imaginary line and the fourth imaginary line in a plan view, and a fourth line configured to transmit the first color data signal from the data distributor to the plurality of fourth sub-pixels.

In a plan view, a portion of the fourth line may be between the first line and the second line.

In a plan view, a portion of the fourth line may be between the first line and the third line.

BRIEF DESCRIPTION OF THE DRAWINGS

The above and other aspects and features of certain embodiments of the present disclosure will be more apparent from the following description taken in conjunction with the accompanying drawings, in which:

FIG. 5 is a schematic cross-sectional view of the display apparatus of FIG. 1 taken along the line II-II' of FIG. 1;

FIG. 8 is a conceptual diagram schematically illustrating a pixel structure and a wiring structure around a component area of the display apparatus of FIG. 1, according to one or more embodiments;

DETAILED DESCRIPTION

Figure 1:
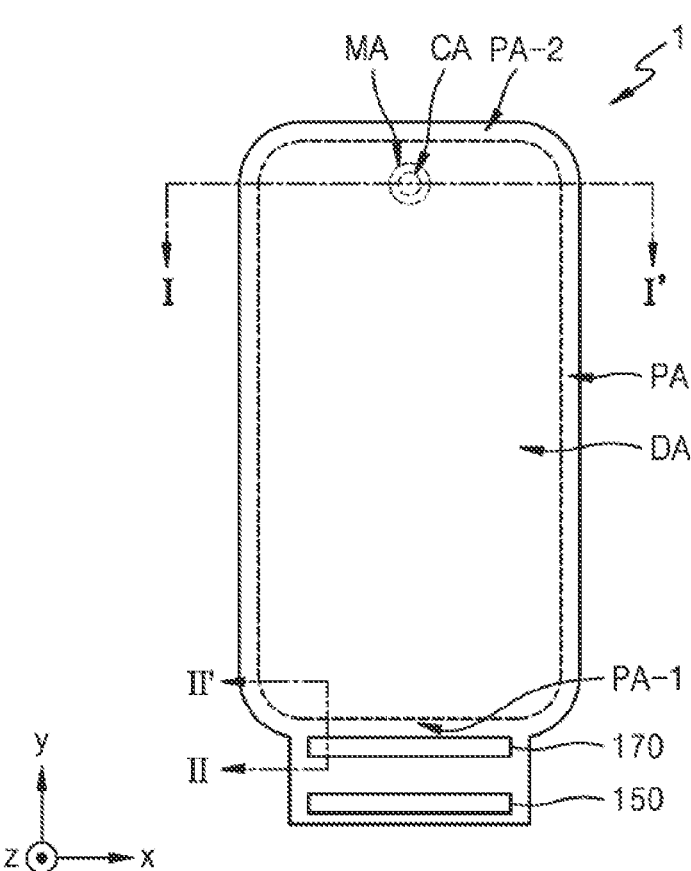
FIG. 1 is a plan view schematically illustrating a display apparatus according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in detail in the written description. Effects, aspects, and features of the present disclosure, and methods of achieving them will be clarified with reference to embodiments described below in detail with reference to the drawings. However, the present disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals.

It will be understood that, when a layer, film, region, or plate is referred to as being "on" another element, the layer, film, region, or plate may be "directly on" the other element, and intervening elements may be present therebetween. Also, sizes of elements in the drawings may be exaggerated or reduced for convenience of explanation. For example, because sizes and thicknesses of elements in the drawings are arbitrarily illustrated for convenience of explanation, the present disclosure is not limited thereto.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

In the following embodiments,, the term "in a plan view" means seeing a target portion from above, and the term "in a cross-sectional view" means seeing a vertically cut cross-section of a target portion from side. In the following embodiments, when a first element "overlaps" a second element, it means that the first element is located above or below the second element.

It will be understood that, when X and Y are referred to as being connected to each other, X and Y may be electrically connected to each other, X and Y may be functionally connected to each other, and X and Y may be directly connected to each other. X and Y may be objects (e.g., devices, elements, circuits, wirings, electrodes, terminals, conductive layers, layers, etc.). Therefore, the present disclosure is not limited to certain connection relationships, for example, connection relationships illustrated in the drawings or proposed in a detailed description, and other connection relationships may be included.

It will be understood that, when X and Y are referred to as being electrically connected to each other, one or more elements (e.g., switches, transistors, capacitive elements, inductors, resistive elements, diodes, etc.) that enable the electrical connection of X and Y may be connected between X and Y.

In the following embodiments, the terms "on" and "off" used in connection with an element state may refer to an activated state of the element and an inactive (or deactivated) state of the element, respectively. The terms "on" and "off" used in connection with a signal received by an element may refer to a signal that activates the element and a signal that deactivates the element, respectively. The element may be activated by a high-level voltage or a low-level voltage. For example, a P-channel transistor is activated by a low-level voltage, and an N-channel transistor is activated by a high-level voltage. Therefore, it will be understood that the "on" voltages for the P-channel transistor (P-type transistor) and the N-channel transistor (N-type transistor) are opposite (low and high) voltage levels.

Hereinafter, a display apparatus according to one or more embodiments will be described in detail, based on the description provided below.

FIG. 1 is a plan view schematically illustrating a display apparatus 1 according to one or more embodiments.

The display apparatus 1 according to the present embodiment may be electronic apparatuses, such as smartphones, mobile phones, navigation systems, game consoles, televisions (TVs), vehicle head units, notebook computers, laptop computers, tablet computers, personal media players (PMPs), or personal digital assistants (PDAs). In addition, the display apparatus 1 according to the present embodiment may be used in dashboards of automobiles, center information displays (CIDs) on the center fascia or dashboards of automobiles, room mirror displays replacing side mirrors of automobiles, and display screens on the rear sides of front seats to serve as entertainment devices for backseat passengers of automobiles. Also, the electronic apparatuses may be flexible apparatus. FIG. 1 illustrates a case where the display apparatus 1 according to the present embodiment is a smartphone.

The display apparatus 1 may include a display area DA and a peripheral area PA outside the display area DA. When viewed from a plan view, the display area DA have may approximately have a rectangular shape. Of course, the present disclosure is not limited thereto. The display area DA may have a polygonal shape (e.g., a triangular shape, a pentagonal shape, or a hexagonal shape), a circular shape, an oval shape, or an irregular shape. A corner of an edge of the display area DA may have a round shape. The peripheral area PA may be a type of a non-display area in which display elements are not arranged. The display area DA may be completely surrounded by the peripheral area PA along an edge or periphery of the display area DA.

Pixels including various display elements, such as organic light-emitting diodes, may be arranged in the display area DA. The pixels may be arranged in various forms, such as a stripe arrangement, a PENTILE® arrangement, or a mosaic arrangement, in the x-axis direction and the y-axis direction and may display an image. The PENTILE® pixel arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

A component area CA may be within the display area DA. The component area CA may be defined by an opening of a substrate (see 200 of FIG. 5) included in the display apparatus 1. As illustrated in FIG. 1, the component area CA may be located in the upper center of the display area DA, and the display area DA outside the component area CA may surround the component area CA. Of course, the component area CA may be within the display area DA in various ways. For example, the component area CA may be located on the upper left side of the display area DA or may be located on the upper right side of the display area DA. Although FIG. 1 illustrates that one component area CA is within the display area DA, the display apparatus 1 may include a plurality of component areas CA.

A middle area MA may be between the display area DA and the component area CA. The middle area MA may have a closed loop shape completely surrounding the component area CA in a plan view.

The peripheral area PA may include a first area PA-1 and a second area PA-2 depending on a position where the peripheral area PA is located. The first area PA-1 is a portion of the peripheral area PA arranged on one side of the component area CA, and may be a portion of the peripheral area PA arranged on an opposite side of the second area PA-2. The first area PA-1 is another portion of the peripheral area PA arranged on the other side of the component area CA, and may be an area where a data driver 150 and/or a data distributor 170, which will be described below, are located. For example, the second area PA-2 may refer to a portion of the peripheral area PA arranged in the +y direction in a plan view. For example, the display area DA may be between the first area PA-1 and the second area PA-2 in a plan view. For example, the component area CA may be between the first area PA-1 and the second area PA-2 in a plan view. In some cases, the first area PA-1 is an area connected to the second area PA-2 and may refer to one of the peripheral areas PA arranged on the left and right of the display area DA in a plan view.

For example, the peripheral area PA may include the first area PA-1 where the data driver 150 and/or the data distributor 170, which will be described below, are located, and the second area PA-2 arranged on the opposite side of the first area PA-1 with respect to the display area DA.

Figure 2:
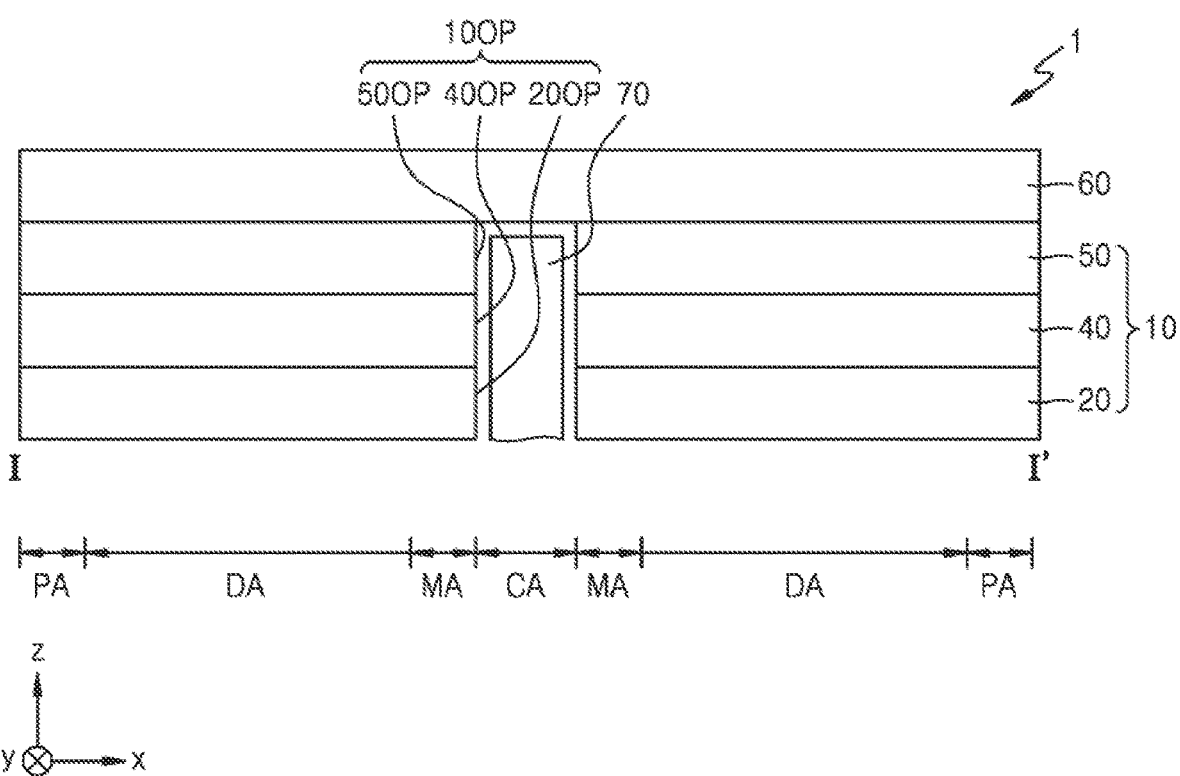
FIG. 2 is a schematic cross-sectional view of the display apparatus of FIG. 1 taken along the line I-I' of FIG. 1.

FIG. 2 is a schematic cross-sectional view of the display apparatus 1 of FIG. 1 taken along the line I-I' of FIG. 1.

As described above, the display apparatus 1 may include a display panel 10 and a component 70 arranged in the component area CA of the display panel 10. The display panel 10 and the component 70 may be accommodated by a housing.

The display panel 10 may include an image generating layer 20, an input sensing layer 40, an optical functional layer 50, and a cover window 60.

The image generating layer 20 may include display elements (or light-emitting elements) configured to emit light in order to display an image. The display element may include a light-emitting diode, for example, an organic light-emitting diode (OLED) including an organic emission layer. Of course, the display element may be an inorganic light-emitting diode including an inorganic material. The inorganic light-emitting diode may include a PN-junction diode including inorganic semiconductor-based materials. When a voltage is applied to the PN-junction diode in a forward direction, holes and electrons may be injected and recombined to generate energy, and the energy may be converted into light energy to emit light of a certain color. The inorganic light-emitting diode may have a width of several to several hundred micrometers or a width of several to several hundred nanometers.

Of course, the present disclosure is not limited thereto. For example, the image generating layer 20 may include a quantum dot layer. That is, light having a wavelength belonging to a specific wavelength band, which is generated in the emission layer of the image generating layer 20, may be converted into light having a preset wavelength by the quantum dot layer.

The input sensing layer 40 may be configured to obtain coordinate information according to an external input, for example, a touch event. The input sensing layer 40 may include a sensing electrode (or a touch electrode) and trace lines connected to the sensing electrode. The input sensing layer 40 may be configured to sense an external input by using a mutual capacitance method and/or a self-capacitance method.

The input sensing layer 40 may be on the image generating layer 20. The input sensing layer 40 may be formed directly on the image generating layer 20, or may be separately formed and bonded to the image generating layer 20 through an adhesive layer such as an optical clear adhesive (OCA). In the former case, the input sensing layer 40 may be continuously formed after the process of forming the image generating layer 20. In this case, the adhesive layer may not be between the input sensing layer 40 and the image generating layer 20. For reference, although FIG. 2 illustrates that the input sensing layer 40 is between the image generating layer 20 and the optical functional layer 50, various modifications may be made thereto. For example, the input sensing layer 40 may be on the optical functional layer 50.

The optical functional layer 50 may include an anti-reflection layer. The anti-reflection layer may reduce the reflectance of light (external light) incident from the outside toward the display panel 10. The anti-reflection layer may include a phase retardation film and a polarizing film. Alternatively, the anti-reflection layer may include a black matrix and color filters. In the latter case, the color filters may be arranged by taking into account the color of light emitted from the image generating layer 20.

In order to improve transmittance of the component area CA, the display panel 10 may include an opening 10OP. Because the display panel 10 has the opening 10OP, the substrate 200, which is one component of the image generating layer 20 included in the display panel 10, may also have an opening, as described above. The opening 10OP may include a first opening 20OP passing through the image generating layer 20, a second opening 40OP passing through the input sensing layer 40, and a third opening 50OP passing through the optical functional layer 50. That is, the first opening 20OP passing through the image generating layer 20, the second opening 40OP passing through the input sensing layer 40, and the third opening 50OP passing through the optical functional layer 50 may overlap each other to form the opening 10OP of the display panel 10.

The cover window 60 may be on the optical functional layer 50. The cover window 60 may be bonded to the optical functional layer 50 through an adhesive layer such as an OCA. The cover window 60 may cover the first opening 20OP passing through the image generating layer 20, the second opening 40OP passing through the input sensing layer 40, and the third opening 50OP passing through the optical functional layer 50. The cover window 60 may include glass or plastic. When the cover window 60 includes glass, the cover window 60 may include ultra-thin glass. When the cover window 60 includes plastic, the cover window 60 may include polyethersulfone, polyacrylate, polyether imide, polyethylene naphthalate, polyethylene terephthalate, polyphenylene sulfide, polyarylate, polyimide, polycarbonate, or cellulose acetate propionate.

The component area CA may be a type of component area (e.g., a sensor area, a camera area, a speaker area, etc.) in which the component 70 configured to add various functions to the display apparatus 1 is located.

The component 70 that is an electronic element may be arranged to correspond to the component area CA in the −z direction. The component 70 may be a camera or a sensor, which is an electronic element that uses light or sound. The sensor may be a proximity sensor configured to measure a distance or an illumination sensor configured to measure brightness. The electronic element that uses light may use light of various wavelength bands, such as visible light, infrared light, or ultraviolet light. The component area CA may allow light or/and sound to be output from the component 70 to the outside, or may allow external light or/and sound to propagate toward the component 70.

Figure 3:
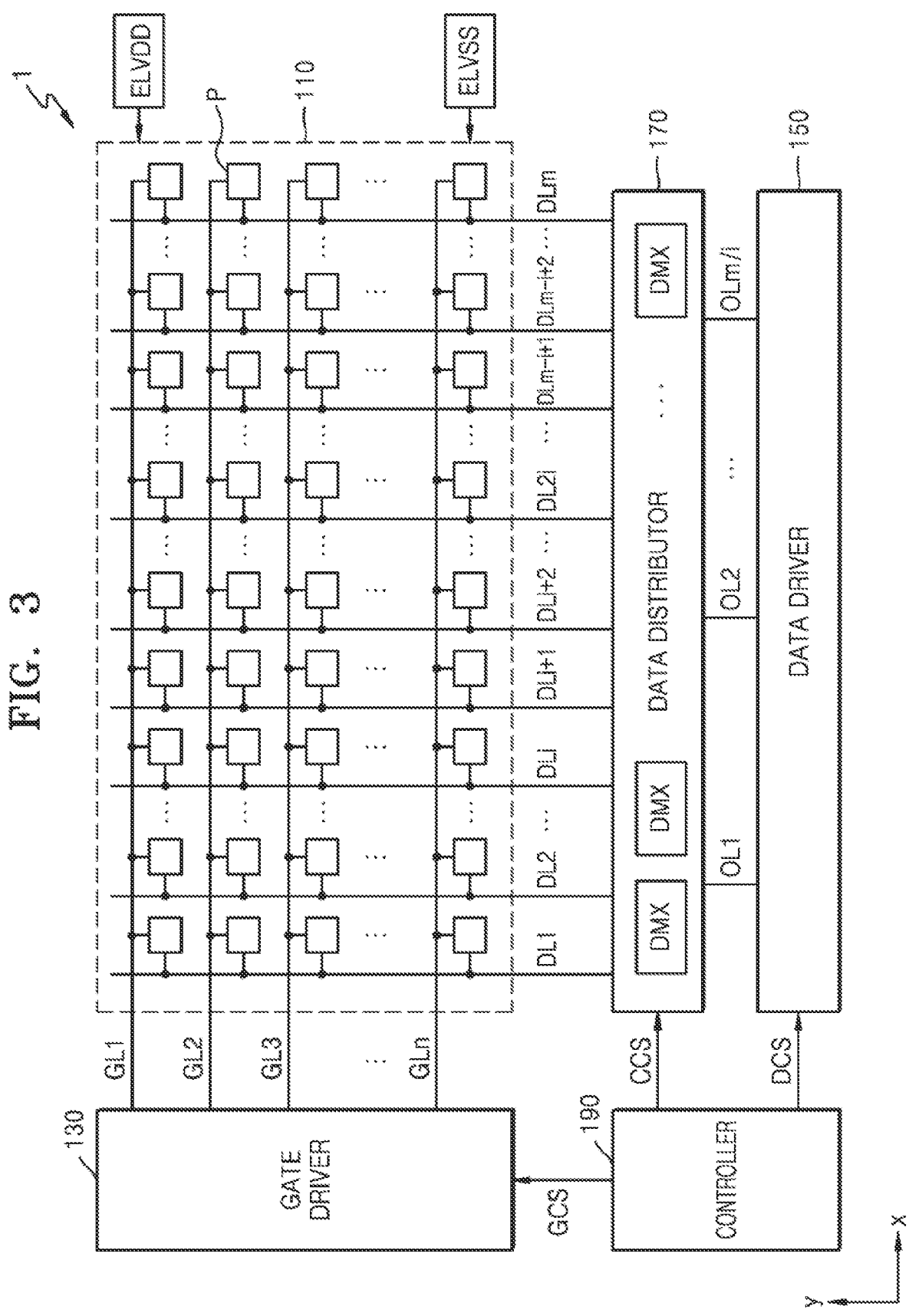
FIG. 3 is a plan view schematically illustrating a display apparatus according to one or more embodiments.

FIG. 3 is a plan view schematically illustrating a display apparatus 1 according to one or more embodiments.

As illustrated in FIG. 3, the display apparatus 1 may include a pixel portion 110, a gate driver 130, a data driver 150, a data distributor 170, and a controller 190.

The pixel portion 110 in which a plurality of pixels P are arranged may be in the display area (see DA of FIG. 1). The gate driver 130, the data driver 150, the data distributor 170, and the controller 190 may be in the peripheral area (see PA of FIG. 1).

The pixels P may each be connected to a corresponding gate line from among a plurality of gate lines GL1 to GLn and a corresponding data line from among a plurality of data lines DL1 to DLm. The gate lines GL1 to GLn may each extend in a first direction (e.g., an x-axis direction or a row direction) and may each be connected to the pixels P located on the same row. The gate lines GL1 to GLn may be configured to transmit a gate signal to the pixels P located on the same row. The data lines DL1 to DLm may each extend in a second direction (e.g., a y-axis direction or a column direction) and may each be connected to the pixels P located on the same column.

The gate driver 130 may be connected to the gate lines GL1 to GLn and configured to generate the gate signal in response to a gate driving control signal GCS from the controller 190 and sequentially supply the gate signal to the gate lines GL1 to GLn. When the gate signal is sequentially supplied to the gate lines GL1 to GLn, the pixels P may be selected in units of rows. The data lines DL1 to DLm may be configured to transmit a data signal to the pixels P located on the selected row. The gate line may be connected to a gate of a transistor included in the pixel P. The gate signal may be a gate control signal for controlling turn-on and turn-off of the transistor connected to the gate line. The gate signal may be a square wave signal in which an on-voltage for turning on the transistor and an off-voltage for turning off the transistor are repeated.

The data driver 150 may be connected to a plurality of output lines OL1 to OLm/i, and the output lines OL1 to OLm/i may be connected to the data lines DL1 to DLm through the data distributor 170. The data driver 150 may be configured to convert an image signal into a data signal of a voltage or current form in response to a data driving control signal DCS received from the controller 190. The data driver 150 may be configured to supply the data signal to the data distributor 170 through the output lines OL1 to OLm/i.

The data distributor 170 may be connected between the output lines OL1 to OLm/i and the data lines DL1 to DLm. The data distributor 170 may include m/i demultiplexers DMX (where i is a natural number greater than or equal to 2) including a plurality of switches. That is, the data distributor 170 may include the same number of demultiplexers DMX as the number of output lines. One end of the demultiplexer DMX may be connected to one corresponding output line from among the output lines OL1 to OLm/i. The other end of the demultiplexer DMX may be connected to i data lines. The demultiplexer DMX may be configured to supply the data signal supplied from the corresponding output line to the i data lines. Because the use of the demultiplexer DMX requires fewer output lines than data lines, the number of output lines connected to the data driver 150 may be reduced, and thus, manufacturing costs may be reduced. The demultiplexer DMX may include a plurality of switches connected to the corresponding output line and the m data lines.

The controller 190 may be configured to generate the data driving control signal DCS and the gate driving control signal GCS in response to synchronization signals supplied from the outside. The controller 190 may be configured to output the data driving control signal DCS to the data driver 150 and output the gate driving control signal GCS to the gate driver 130. The controller 190 may be configured to output a distribution control signal CCS to the data distributor 170, and the data distributor 170 may be configured to selectively connect the output lines OL1 to OLm/i to the data lines DL1 to DLm in response to the distribution control signal CCS. The controller 190 may be configured to output i distribution control signals CCS to the demultiplexers DMX so that i data signals supplied to one output line are time-divisionally supplied to m data lines. The i distribution control signals CCS may be sequentially output so as not to overlap each other.

The gate driver 130, the data distributor 170, and the controller 190 may be directly formed on the substrate 200. The data driver 150 may be on a flexible printed circuit board (FPCB) that is electrically connected to a pad on one side of the substrate 200. In another embodiment, the data driver 150 may be directly on the substrate 200 in a chip-on-glass (COG) or chip-on-plastic (COP) manner.

When the display apparatus 1 is an organic light-emitting display apparatus, a first power supply voltage ELVDD and a second power supply voltage ELVSS may be supplied to the pixels P of the display apparatus 1. The first power supply voltage ELVDD may be a high-level voltage provided to a first electrode (e.g., a pixel electrode or an anode electrode) of the display element (e.g., the light-emitting element) included in each of the pixels P. The second power supply voltage ELVSS may be a low-level voltage provided to a second electrode (e.g., an opposite electrode or a cathode electrode) of the display element included in each of the pixels P. The first power supply voltage ELVDD and the second power supply voltage ELVSS are driving voltages for allowing the pixels P to emit light.

Hereinafter, an organic light-emitting display apparatus will be described as an example of the display apparatus 1 according to one or more embodiments, but the display device according to the present disclosure is not limited thereto. In another embodiment, examples of the display apparatus 1 according to the present disclosure may include an inorganic light-emitting display (or an inorganic electroluminescence (EL) display), a quantum dot light-emitting display, and the like.

Figure 4:
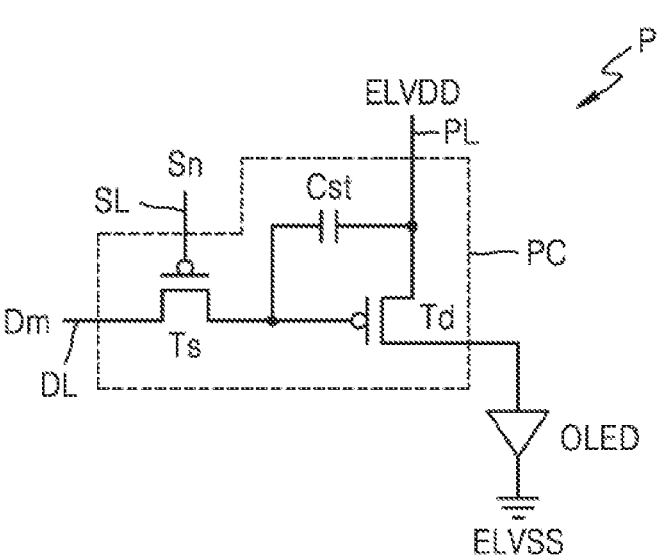
FIG. 4 is an equivalent circuit diagram of a pixel included in a display panel of FIG. 1.

FIG. 4 is an equivalent circuit diagram of a pixel P included in a display panel of FIG. 1.

As illustrated in FIG. 4, the pixel P may include a pixel circuit PC connected to a scan line SL and a data line DL, and an organic light-emitting diode OLED connected to the pixel circuit PC.

The pixel circuit PC may include a driving thin-film transistor Td, a switching thin-film transistor Ts, and a storage capacitor Cst. The switching thin-film transistor Ts may be connected to the scan line SL and the data line DL and may be configured to transmit, to the driving thin-film transistor Td, a data signal Dm input through the data line DL in response to a scan signal Sn input through the scan line SL.

The storage capacitor Cst may be connected to the switching thin-film transistor Ts and a driving voltage line PL and may be configured to store a voltage corresponding to a difference between a voltage received from the switching thin-film transistor Ts and a first power supply voltage ELVDD supplied to the driving voltage line PL.

A second power supply voltage ELVSS may be a driving voltage having a relatively lower level than the first power supply voltage ELVDD. The level of the driving voltage supplied to the pixel P may be the difference between the level of the first power supply voltage ELVDD and the level of the second power supply voltage ELVSS.

The driving thin-film transistor Td may be connected to the driving voltage line PL and the storage capacitor Cst at one electrode, and may be connected to the organic light-emitting diode OLED at an other electrode, and may be configured to control a driving current flowing from the driving voltage line PL to the organic light-emitting diode OLED according to a voltage value stored in the storage capacitor Cst. The organic light-emitting diode OLED may be configured to emit light having a certain luminance according to the driving current.

Although FIG. 4 illustrates that the circuit PC includes two thin-film transistors (TFTs) and one storage capacitor, but the present disclosure is not limited thereto. The pixel circuit PC may include two or more storage capacitors.

Figure 5:
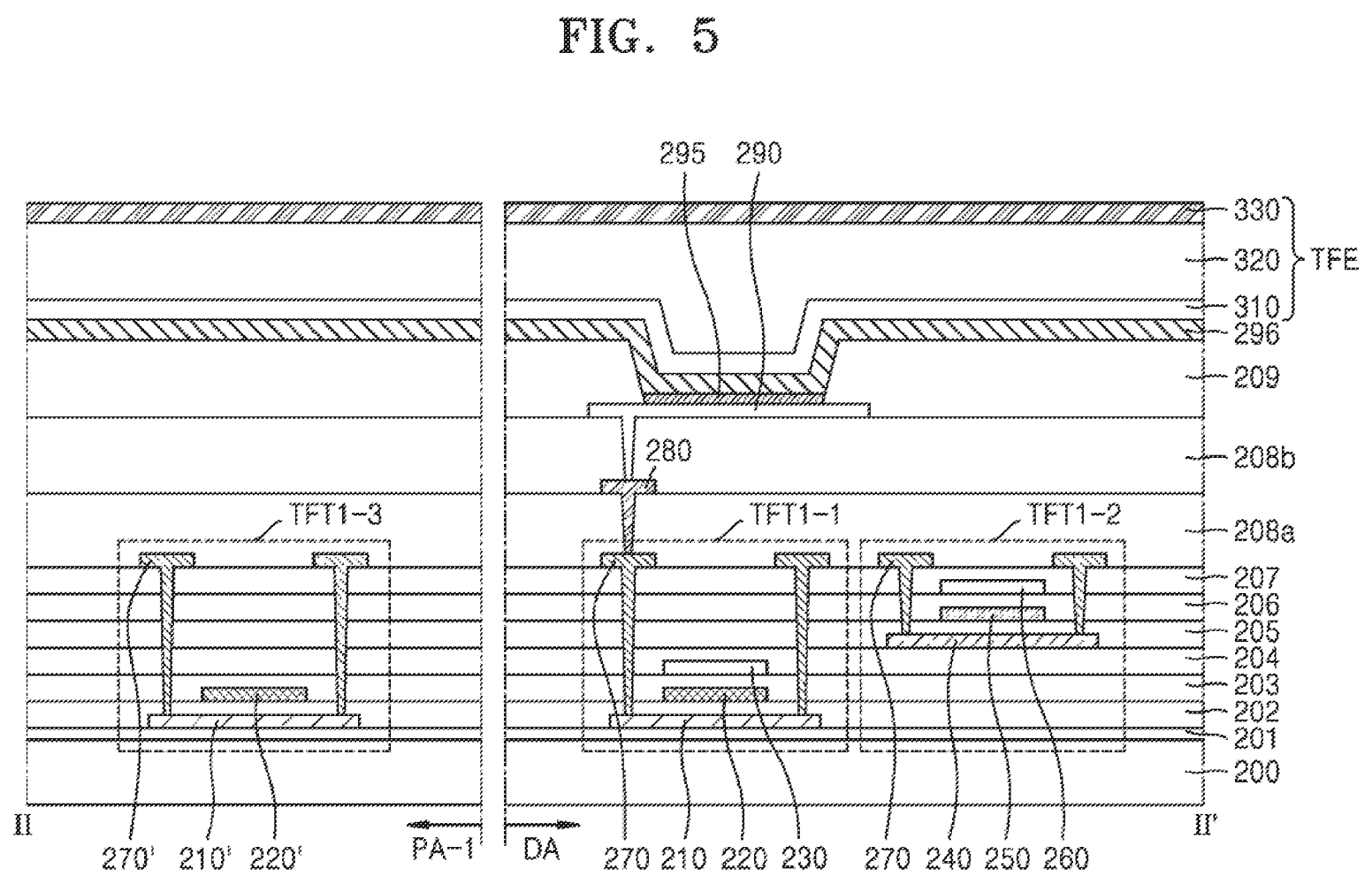

FIG. 5 is a schematic cross-sectional view of the display apparatus 1 of FIG. 1 taken along the line II-II' of FIG. 1. For convenience of explanation, a portion of the cross-section taken along the line II-II' of the display apparatus 1 of FIG. 1 may be omitted.

As described above, the substrate 200 may include areas corresponding to the display area DA and the peripheral area PA outside the display area DA. The substrate 200 may include various flexible or bendable materials. For example, the substrate 200 may include glass, metal, and/or polymer resin. In addition, the substrate 200 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. Of course, various modifications are possible. For example, the substrate 200 may have a multilayer structure that includes two layers including polymer resin and a barrier layer including an inorganic material (e.g., silicon oxide, silicon nitride, silicon oxynitride, etc.) between the two layers.

A buffer layer 201 may be on the substrate 200. The buffer layer 201 may act as a barrier layer and/or a blocking layer that prevents impurity ions from diffusing, prevents infiltration of moisture or ambient air, and performs surface planarization. The buffer layer 201 may include silicon oxide, silicon nitride, and/or silicon oxynitride. In addition, the buffer layer 201 may control the rate of heat supply during a crystallization process for forming first semiconductor layers 210 and 210' so that the semiconductor layers 210 and 210' are substantially uniformly (e.g., uniformly) crystallized.

The first semiconductor layers 210 and 210' may be on the buffer layer 201. The first semiconductor layers 210 and 210' may each include polysilicon. The first semiconductor layers 210 and 210' may each include a channel region undoped with impurities, and a source region and a drain region respectively formed by doping impurities into both sides of the channel region. The impurities may vary depending on the type of the thin-film transistor and may be an N-type impurity or a P-type impurity.

A first gate insulating layer 202 may be on the first semiconductor layers 210 and 210' and the buffer layer 201. The first gate insulating layer 202 may be configured to secure insulation between the first semiconductor layers 210 and 210' and a first gate layer 220 to be described below. The first gate insulating layer 202 may include an inorganic material, such as silicon oxide, silicon nitride, and/or silicon oxynitride, and may be between the first semiconductor layers 210 and 210' and the first gate layer 220. In addition, the first gate insulating layer 202 may have a shape corresponding to the entire surface of the substrate 200 and may have a structure in which contact holes are formed in preset portions. The first gate insulating layer including the inorganic material may be formed by chemical vapor deposition (CVD) or atomic layer deposition (ALD). The same applies to embodiments and modifications to be described below.

The first gate layer 220 may be on the first gate insulating layer 202. The first gate layer 220 may be arranged at positions vertically overlapping the first semiconductor layer 210 and may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), or copper (Cu).

A 1'st gate layer 220' may be on the first gate insulating layer 202, may be arranged at positions vertically overlapping the first semiconductor layers 210', and may be in a first area PA-1 of the peripheral area PA. The 1'st gate layer 220' may be arranged on the same layer as the first gate layer 220 and may include the same material as the material of the first gate layer 220. The 1'st gate layer 220' and the first gate layer 220 may be concurrently (e.g., simultaneously) formed in the same process.

A first interlayer insulating layer 203 may be on the first gate layer 220 and the first gate insulating layer 202. The first interlayer insulating layer 203 may cover the first gate layer 220. The first interlayer insulating layer 203 may include an inorganic material. For example, the first interlayer insulating layer 203 may include metal oxide or metal nitride. Specifically, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In one or more embodiments, the first interlayer insulating layer 203 may have a dual structure of $SiO_x/SiN_y$ or $SiN_x/SiO_y$.

A second gate layer 230 may be on the first interlayer insulating layer 203. In some cases, the second gate layer 230 may be omitted.

The second gate layer 230 may be arranged at a position vertically overlapping the first gate layer 220. Although omitted for convenience of explanation, unlike as illustrated in FIG. 5, a 2'nd gate layer formed concurrently (e.g., simultaneously) with the second gate layer 230 may be on the 1'st gate layer 220' arranged in the first area PA-1.

The second gate layer 230 may include at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and/or copper (Cu).

In some cases, the second gate layer 230 and the first gate layer 220 may form a storage capacitor. The first gate layer 220 may include a first electrode of the storage capacitor, and the second gate layer 230 may include a second electrode of the storage capacitor.

A second interlayer insulating layer 204 may be on the second gate layer 230 and the first interlayer insulating layer 203. The second interlayer insulating layer 204 may cover the second gate layer 230. The second interlayer insulating layer 204 may include an inorganic material. For example, the second interlayer insulating layer 204 may include metal oxide or metal nitride. Specifically, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). In one or more embodiments, the second interlayer insulating layer 204 may have a dual structure of $SiO_x/SiN_y$ or $SiN_x/SiO_y$.

A second semiconductor layer 240 may be on the second interlayer insulating layer 204. The second semiconductor layer 240 may include polysilicon or silicon oxide. Specifically, the second semiconductor layer 240 may mainly include silicon oxide. The second semiconductor layer 240 may include a channel region undoped with impurities, and a source region and a drain region respectively formed by doping impurities into both sides of the channel region. The impurities may vary depending on the type of the thin-film transistor and may be an N-type impurity or a P-type impurity.

A second gate insulating layer 205 may be on the second semiconductor layer 240 and the second interlayer insulating layer 204. The second gate insulating layer 205 may be configured to secure gate interlayer insulation from the second semiconductor layer 240. The second gate insulating layer 205 may include an inorganic material, such as silicon oxide, silicon nitride, and/or silicon oxynitride, and may be between the second semiconductor layer 240 and a third gate layer 250 to be described below. In addition, the second gate insulating layer 205 may have a shape corresponding to the entire surface of the substrate 200 and may have a structure in which contact holes are formed in preset portions. The second gate insulating layer 205 including the inorganic material may be formed by CVD or ALD. The same applies to embodiments and modifications to be described below.

A third gate layer 250 may be on the second gate insulating layer 205. The third gate layer 250 may be arranged at a position vertically overlapping the second semiconductor layer 240 and may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and/or copper (Cu).

A third interlayer insulating layer 206 may be on the third gate layer 250 and the second gate insulating layer 205. The third interlayer insulating layer 206 may cover the third gate layer 250. The third interlayer insulating layer 206 may include an inorganic material. For example, the third interlayer insulating layer 206 may include metal oxide or metal nitride. Specifically, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$, and/or zinc oxide ($ZnO_2$). In one or more embodiments, the third interlayer insulating layer 206 may have a dual structure of $SiO_x/SiN_y$ or $SiN_x/SiO_y$.

A fourth gate layer 260 may be on the third interlayer insulating layer 206. In some cases, the fourth gate layer 260 may be omitted.

The fourth gate layer 260 may be arranged at a position vertically overlapping the third gate layer 250 and may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and/or copper (Cu).

In some cases, the fourth gate layer 260 and the third gate layer 250 may form a storage capacitor. The fourth gate layer 260 may include a first electrode of the storage capacitor, and the third gate layer 250 may include a second electrode of the storage capacitor.

The fourth interlayer insulating layer 207 may be on the fourth gate layer 260 and the third interlayer insulating layer 206. The fourth interlayer insulating layer 207 may cover the fourth gate layer 260. The fourth interlayer insulating layer 207 may include an inorganic material. For example, the fourth interlayer insulating layer 207 may include metal oxide or metal nitride. Specifically, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). In one or more embodiments, the fourth interlayer insulating layer 207 may have a dual structure of $SiO_x/SiN_y$ or $SiN_x/SiO_y$.

A first conductive layer 270 may be on the fourth interlayer insulating layer 207. The first conductive layer 270 may act as electrodes connected to the source/drain regions of the first semiconductor layers 210 through through-holes passing through the first gate insulating layer 202 to the fourth interlayer insulating layer 207.

The first conductive layer 270 may act as electrodes connected to the source/drain regions of the second semiconductor layer 240 through through-holes passing through the second gate insulating layer 205 to the fourth interlayer insulating layer 207.

The first conductive layer 270 may include at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). For example, the first conductive layer 270 may include a Ti layer, an Al layer, and/or a Cu layer.

A 1'st conductive layer 270', which is arranged on the same layer as the first conductive layer 270 and arranged in the first area PA-1, may be on the fourth interlayer insulating layer 207. The 1'st conductive layer 270' may be arranged on the same layer as the first conductive layer 270 and may include the same material as the material of the first conductive layer 270. In addition, the 1'st conductive layer 270' and the first conductive layer 270 may be concurrently (e.g., simultaneously) formed in the same process. As a result, the structure of the 1'st conductive layer 270' may be the same as the structure of the first conductive layer 270. The 1'st conductive layer 270' may act as electrodes connected to the source/drain regions of the first semiconductor layers 210' through through-holes passing through the first gate insulating layer 202 to the fourth interlayer insulating layer 207.

The first conductive layer 270 and/or the 1'st conductive layer 270' may constitute at least a portion of data lines or wirings to be described below. In addition, FIGS. 8 to 10 to be described below illustrate planar data lines and wirings for convenience of explanation, and the data lines and wirings may include the first conductive layer 270 and/or the 1'st conductive layer 270'.

A first organic insulating layer 208a may be on the first conductive layer 270 and the fourth interlayer insulating layer 207. The first organic insulating layer 208a may be an organic insulating layer acting as a planarization layer because the first organic insulating layer 208a covers the upper portion of the first conductive layer 270 and has a substantially flat upper surface. The first organic insulating layer 208a may include, for example, an organic material, such as acryl, benzocyclobutene (BCB), and/or hexameth-yldisiloxane (HMDSO). The first organic insulating layer 208a may be variously modified. For example, the first organic insulating layer 208a may include a single layer or multiple layers.

A second conductive layer 280 may be on the first organic insulating layer 208a. The second conductive layer 280 may act as electrodes connected to the source/drain regions of the semiconductor layer through a through-hole included in the first organic insulating layer 208a. The second conductive layer 280 may include at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). For example, the second conductive layer 280 may include a Ti layer, an Al layer, and/or a Cu layer.

The first conductive layer 270, the 1'st conductive layer 270', and the second conductive layer 280 may constitute at least a portion of data lines or wirings to be described below. In addition, FIGS. 8 to 10 to be described below illustrate planar data lines and wirings for convenience of explana-tion, and the data lines and wirings may include the first conductive layer 270, the 1'st conductive layer 270', and the second conductive layer 280.

A second organic insulating layer 208b may be on the first conductive layer 270 and the first organic insulating layer 208a. The second organic insulating layer 208b may be an organic insulating layer acting as a planarization layer because the second organic insulating layer 208b covers the upper portion of the first conductive layer 270 and has a substantially flat upper surface. The second organic insulat-ing layer 208b may include, for example, an organic mate-rial, such as acryl, BCB, and/or HMDSO. The second organic insulating layer 208b may be variously modified. For example, the second organic insulating layer 208b may include a single layer or multiple layers.

In addition, an additional conductive layer and an addi-tional insulating layer may be between the conductive layer and a pixel electrode 290 and may be applied to various embodiments. In this case, the additional conductive layer may include the same material as the conductive layer described above and may have the same layer structure as the conductive layer described above. The additional insu-lating layer may include the same material as the organic insulating layer described above and may have the same layer structure as the organic insulating layer described above.

The pixel electrode 290 may be on the second organic insulating layer 208b. The pixel electrode 290 may be connected to the second conductive layer 280 through a contact hole formed in the second organic insulating layer 208b. A display element may be on the pixel electrode 290. An organic light-emitting diode may be used as the display element. That is, the organic light-emitting diode may be on the pixel electrode 290. The pixel electrode 290 may include a transmissive conductive layer including a transmissive conductive oxide, such as indium tin oxide (ITO), $In_2O_3$, or indium zinc oxide (IZO), and a reflective layer including a metal such as Al or Ag. For example, the pixel electrode 290 may have a three-layer structure of ITO/Ag/ITO.

A pixel defining layer 209 may be on the second organic insulating layer 208b and may cover the edge of the pixel electrode 290. That is, the pixel defining layer 209 may cover the edge of the pixel electrode 290. The pixel defining layer 209 may have an opening corresponding to a pixel. The opening may be formed to expose at least the central portion of the pixel electrode 290. The pixel defining layer 209 may include, for example, an organic material, such as polyimide and/or HMDSO.

An intermediate layer 295 and an opposite electrode 296 may be on the opening of the pixel defining layer 209. The intermediate layer 295 may include a low molecular weight material or a high molecular weight material. When the intermediate layer 295 includes a low molecular weight material, the intermediate layer 295 may include a hole injection layer, a hole transport layer (HTL), an emission layer (EML), an electron transport layer, and/or an electron injection layer. When the intermediate layer 295 includes a high molecular weight material, the intermediate layer 295 may have a structure including an HTL and an EML.

The opposite electrode 296 may include a transmissive conductive layer including a transmissive conductive oxide, such as ITO, $In_2O_3$, or IZO. The pixel electrode 290 is used as an anode and the opposite electrode 296 is used as a cathode. Of course, the polarities of the pixel electrode 290 and the opposite electrode 296 may be reversed.

The structure of the intermediate layer 295 is not limited thereto and may have various structures. For example, at least one of layers constituting the intermediate layer 295 may be integrally formed as a single body like the opposite electrode 296. In one or more embodiments, the intermedi-ate layer 295 may include a layer patterned to correspond to each of the pixel electrodes 290.

The opposite electrode 296 may be on the display area DA and may be in front of the display area DA. That is, the opposite electrode 296 may be integrally formed as a single body to cover the pixels. The opposite electrode 296 may electrically contact a common power supply line arranged in the peripheral area PA. In one or more embodiments, the opposite electrode 296 may extend to a barrier wall. A thin-film encapsulation layer TFE may completely cover the display area DA and may extend toward the peripheral area PA and cover at least a portion of the peripheral area PA.

The thin-film encapsulation layer TFE may extend to the outside of the common power supply line. The thin-film encapsulation layer TFE may include a first inorganic encap-sulation layer 310, a second inorganic encapsulation layer 330, and an organic encapsulation layer 320 therebetween. The first inorganic encapsulation layer 310 and the second inorganic encapsulation layer 330 may each include at least one inorganic material selected from among aluminum oxide, titanium oxide, tantalum oxide, hafnium oxide, zinc oxide, silicon oxide, silicon nitride, and/or silicon oxyni-tride.

The first inorganic encapsulation layer 310 and the second inorganic encapsulation layer 330 may each be a single layer or multiple layers including one or more inorganic materials described above. The first inorganic encapsulation layer 310 and the second inorganic encapsulation layer 330 may include the same material as each other or may include different materials from each other. The thickness of the first inorganic encapsulation layer 310 may be different from the thickness of the second inorganic encapsulation layer 330. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the thicknesses of the first inorganic encapsulation layer 310 may be equal to the thickness of the second inorganic encapsulation layer 330.

The organic encapsulation layer 320 may include a monomer-based material or a polymer-based material. The polymer-based material may include acrylic resin, epoxy-based resin, polyimide, polyethylene, and/or the like. In one or more embodiments, the organic encapsulation layer 320 may include acrylate.

A barrier wall may be on the peripheral area PA of the substrate 200. The barrier wall may surround the display area DA and may prevent the organic encapsulation layer 320 of the thin-film encapsulation layer TFE from overflowing to the outside of the substrate 200. Accordingly, the organic encapsulation layer 320 may be in contact with the inner surface of the barrier wall facing the display area DA. At this time, it will be understood that the expression "the organic encapsulation layer 320 is in contact with the inner surface of the barrier wall" may mean that the first inorganic encapsulation layer 310 is between the organic encapsulation layer 320 and the barrier wall and the organic encapsulation layer 320 is in contact with the first inorganic encapsulation layer 310.

The first inorganic encapsulation layer 310 and the second inorganic encapsulation layer 330 may be on the barrier wall and may extend toward the edge of the substrate 200. However, in some cases, a plurality of barrier walls may be included.

As illustrated in FIG. 5, a first-first thin-film transistor TFT1-1 and a first-second thin-film transistor TFT1-2 may be arranged in the display area DA in order to implement a pixel circuit. In addition, a first-third thin-film transistor TFT1-3 corresponding to a switch included in a demultiplexer DMX to be described below may be in the first area PA-1 in order to distribute data. The first-third thin-film transistor TFT1-3 and the first-first transistor TFT1-1 may be concurrently (e.g., simultaneously) formed in the same process. That is, the first-third thin-film transistor TFT1-3 may be arranged on the same layer as the first-first thin-film transistor TFT1-1.

However, in some cases, an element corresponding to the second gate layer 230 of the first-first thin-film transistor TFT1-1 may be omitted in the first-third thin-film transistor TFT1-3. This is because a separate capacitor structure is not required to implement the demultiplexer.

In one or more embodiments, the 1'st conductive layer 270' and the first conductive layer 270 may be electrically connected to each other. For example, in order to electrically connect the 1'st conductive layer 270' to the first conductive layer 270, a bridge wiring may be further added to the same layer as the second conductive layer 280. For example, in order to electrically connect the 1'st conductive layer 270' to the first conductive layer 270, an additional wiring configured to connect the 1'st conductive layer 270' to the first conductive layer 270 may be arranged on the same layer as the 1'st conductive layer 270' or the first conductive layer 270. For example, in order for the 1'st conductive layer 270' and the first conductive layer 270 to be electrically connected to each other, the 1'st conductive layer 270' and the first conductive layer 270 may be formed in a pattern connected to each other from the beginning.

Figure 6:
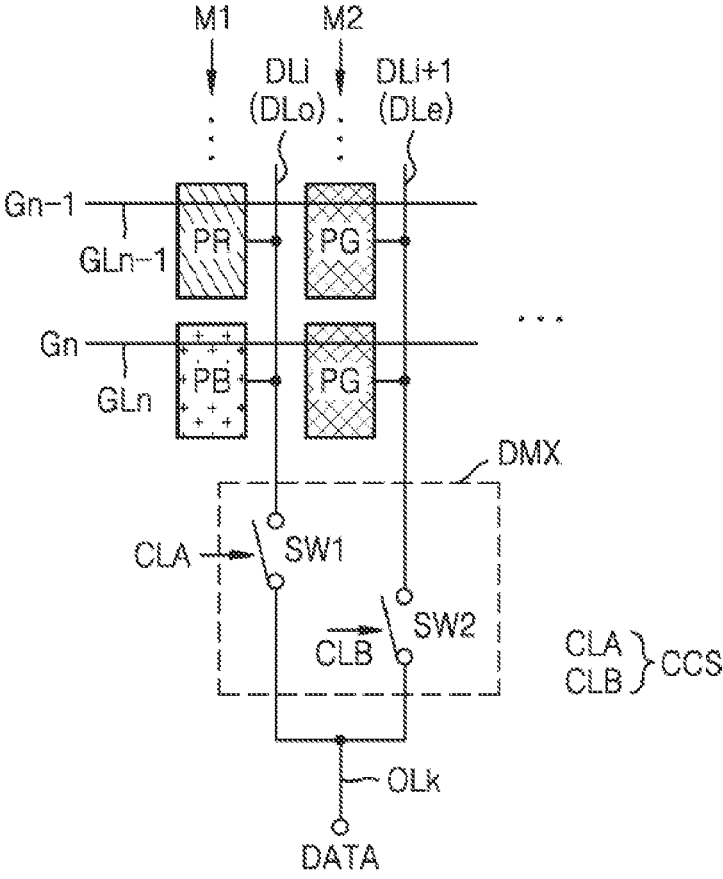
FIG. 6 is a diagram for describing an example of a demultiplexer included in a data distributor of FIG. 3.

FIG. 6 is a diagram for describing an example of the demultiplexer DMX included in the data distributor 170 of FIG. 3.

FIG. 6 illustrates an example of the demultiplexer DMX configured to selectively connect a $k^{th}$ output line OLk to one pair of an $i^{th}$ data line DLi and a (i+1)th data line DLi+1 adjacent to each other. The demultiplexer DMX may include a first switch SW1 and a second switch SW2.

The first switch SW1 may be between the $k^{th}$ output line OLk and the $i^{th}$ data line DLi. The first switch SW1 may be configured to connect the $k^{th}$ output line OLk to the $i^{th}$ data line DLi in response to a first control signal CLA, so that a data signal DATA applied to the $k^{th}$ output line OLk is supplied to the $i^{th}$ data line DLi.

The second switch SW2 may be between the $k^{th}$ output line OLk and the $(i+1)^{th}$ data line DLi+1. The second switch SW2 may be configured to connect the $k^{th}$ output line OLk to the $(i+1)^{th}$ data line DLi+1 in response to a second control signal CLB, so that the data signal DATA applied to the $k^{th}$ output line OLk is supplied to the $(i+1)^{th}$ data line DLi+1.

A distribution control signal CCS may include the first control signal CLA and the second control signal CLB. The first control signal CLA and the second control signal CLB may be alternately applied at different timings without overlapping each other.

The pixels P may include a first pixel PR, a second pixel PB, and a third pixel PG, which are configured to emit light of different colors. For reference, in the present disclosure, the first, second, and third pixels PR, PB, and PG may be collectively referred to as "sub-pixels" as will be described below.

In one or more embodiments, the first pixel PR and the second pixel PB may be alternately arranged in a column M1 where the $i^{th}$ data line DLi is arranged, and may be connected to the $i^{th}$ data line DLi. The third pixel PG may be repeatedly arranged in a column M2 where the $(i+1)^{th}$ data line DLi+1 is arranged, and may be connected to the $(i+1)^{th}$ data line DLi+1. One of the $i^{th}$ data line DLi and the $(i+1)^{th}$ data line DLi+1 may be an odd data line DLo and the other thereof may be an even data line DLe. FIG. 6 illustrates an example in which the $i^{th}$ data line DLi is an odd data line DLo and the $(i+1)^{th}$ data line DLi+1 is an even data line DLe. One pair of data lines connected to the demultiplexer DMX may be one pair of an odd data line and an even data line that are spaced from each other by one column. The first pixel PR may be a red pixel configured to emit red light, the second pixel PB may be a blue pixel configured to emit blue light, and the third pixel PG may be a green pixel configured to emit green light.

FIG. 6 illustrates the pixels P connected to an $(n-1)^{th}$ gate line GLn−1 arranged in an $(n-1)^{th}$ row and an $n^{th}$ gate line GLn arranged in an n row. The gate lines GLn−1 and GLn illustrated in FIG. 6 may be the gate lines GL1 to GLn illustrated in FIG. 3.

Figure 7:
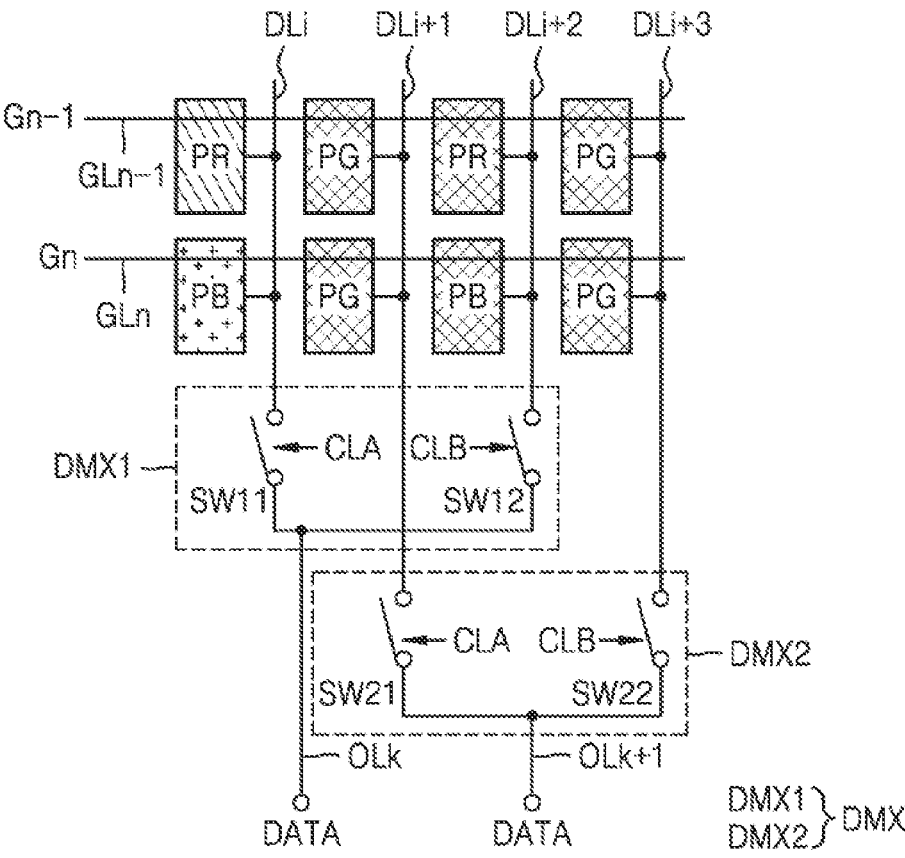
FIG. 7 is a diagram for describing an example of a demultiplexer included in a data distributor of FIG. 3.

FIG. 7 is a diagram for describing an example of the demultiplexer DMX included in the data distributor 170 of FIG. 3. Hereinafter, descriptions previously given with reference to FIG. 7 are omitted.

As illustrated in FIG. 7, the data distributor 170 according to one or more embodiments may include a plurality of demultiplexers DMX. The demultiplexers DMX may include first demultiplexers DMX1 and second demultiplexers DMX2. The first demultiplexer DMX1 may be configured to selectively connect a $k^{th}$ output line OLk to an $i^{th}$ data line DLi and an $(i+2)^{th}$ data line DLi+2. The second demultiplexer DMX2 may be configured to selectively connect a $(k+1)^{th}$ output line OLk+1 to an $(i+1)^{th}$ data line DLi+1 and an $(i+3)^{th}$ data line DLi+3.

The first demultiplexer DMX1 may include a first switch SW11 and a second switch SW12.

The first switch SW11 may be between the $k^{th}$ output line OLk and the $i^{th}$ data line DLi. The first switch SW11 may be configured to connect the $k^{th}$ output line OLk to the $i^{th}$ data line DLi in response to a first control signal CLA, so that a data signal DATA applied to the $k^{th}$ output line OLk is supplied to the $i^{th}$ data line DLi. The second switch SW12 may be between the $k^{th}$ output line OLk and the $(i+2)^{th}$ data line DLi+2. The second switch SW12 may be configured to connect the $k^{th}$ output line OLK to the $(i+2)^{th}$ data line DLi+2 in response to a second control signal CLB, so that the data signal DATA applied to the $k^{th}$ output line OLk is supplied to the $(i+2)^{th}$ data line DLi+2.

The second demultiplexer DMX2 may include a first switch SW21 and a second switch SW22.

The first switch SW21 may be between the $(k+1)^{th}$ output line OLk+1 and the $(i+1)^{th}$ data line DLi+1. The first switch SW21 may be configured to connect the $(k+1)^{th}$ output line OLk+1 to the $(i+1)^{th}$ data line DLi+1 in response to the first control signal CLA, so that the data signal DATA applied to the $(k+1)^{th}$ output line OLk+1 is supplied to the $(i+1)^{th}$ data line DLi+1.

The second switch SW22 may be between the $(k+1)^{th}$ output line OLk+1 and the $(i+3)^{th}$ data line DLi+3. The second switch SW22 may be configured to connect the $(k+1)^{th}$ output line OLk+1 to the $(i+3)^{th}$ data line DLi+3 in response to the second control signal CLB, so that the data signal DATA applied to the $(k+1)^{th}$ output line OLk+1 is supplied to the $(i+3)^{th}$ data line DLi+3.

FIG. 7 illustrates an example in which the $i^{th}$ data line DLi and the (i+2)th data line DLi+2 are odd data lines DLo and the $(i+1)^{th}$ data line DLi+1 and the (i+3)th data line DLi+3 are even data lines DLe. One pair of data lines connected to the first demultiplexer DMX1 may be one pair of odd data lines that are spaced from each other by two columns, and one pair of data lines connected to the second demultiplexer DMX2 may be one pair of even data lines that are spaced from each other by two columns.

Figure 8:
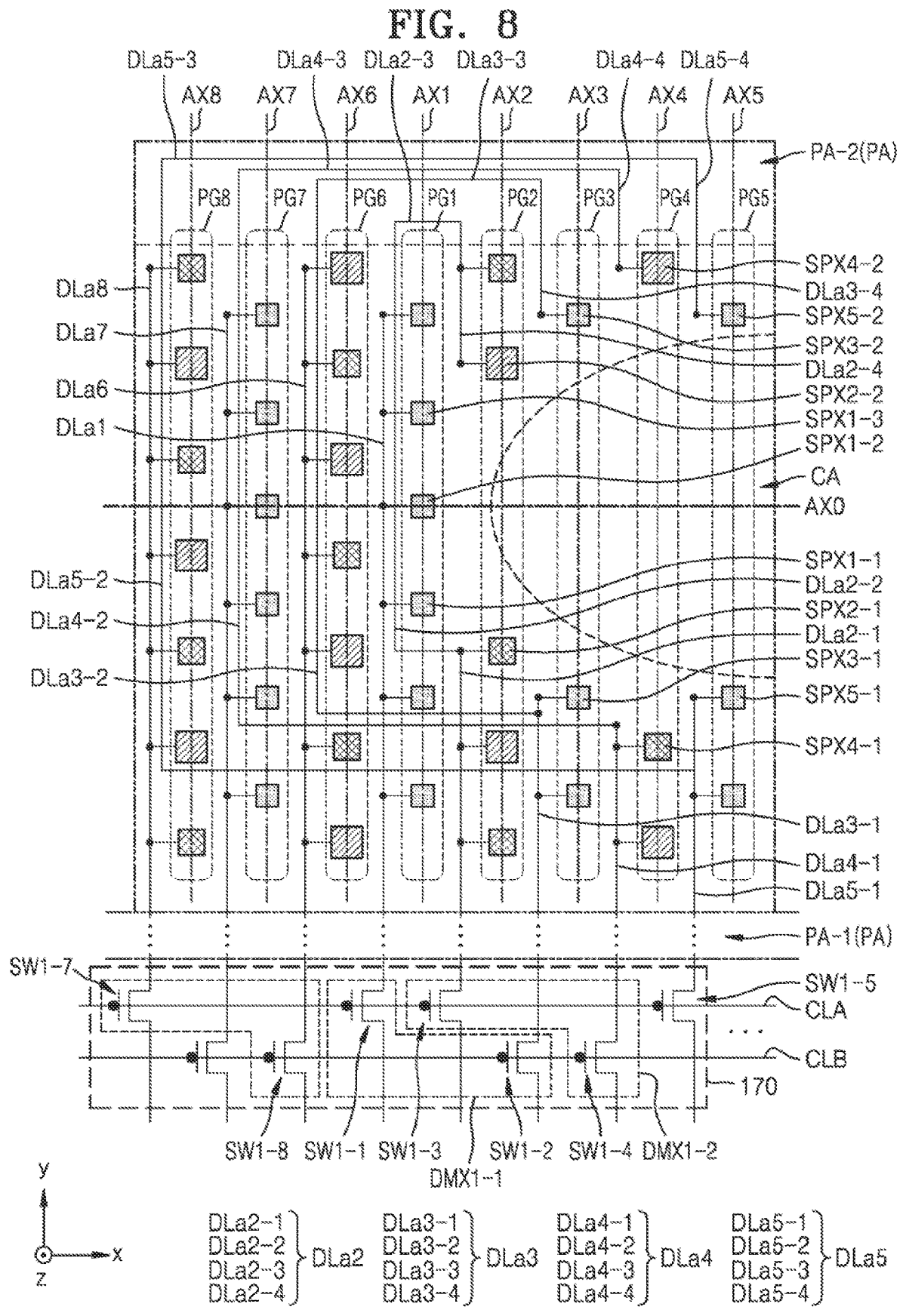

FIG. 8 is a conceptual diagram schematically illustrating a pixel structure and a wiring structure around the component area CA of the display apparatus 1 of FIG. 1, according to one or more embodiments.

For reference, the sub-pixels of FIG. 8 are arranged in a diamond structure, but this is only an example shown to easily express wirings for convenience of explanation and illustration. Even when the sub-pixels are arranged in a different arrangement unlike as illustrated in FIG. 8, it is obvious that wirings may be arranged to have technical features to be described below.

For reference, the display area DA including more than half of the component area CA, a portion of the first area PA-1 of the peripheral area PA, and a portion of the second area PA-2 of the peripheral area PA are illustrated in FIG. 8, but for convenience of explanation, an area between the display area DA and the second area PA-2 of the peripheral area PA may be omitted.

As illustrated in FIG. 8, the sub-pixels may be in the display area DA. For example, in a plan view, a first-first sub-pixel SPX1-1, a second-first sub-pixel SPX2-1, a third-first sub-pixel SPX3-1, and the like may be on one side of the component area CA (in the −y direction). In addition, in a plan view, a first-third sub-pixel SPX1-3, a second-second sub-pixel SPX2-2, a third-second sub-pixel SPX3-2, and the like may be on the other side of the component area CA (in the +y direction).

In a plan view, sub-pixels configured to receive the data signal through one data line may be defined as one sub-pixel group. Accordingly, the display apparatus 1 may include at least first to eighth sub-pixel groups PG1 to PG8.

A data line connected to the first sub-pixel group PG1 and configured to provide the data signal to the sub-pixels included in the first sub-pixel group PG1 may be defined as a first data line DLa1. Similarly, a data line connected to the $n^{th}$ sub-pixel group and configured to provide the data signal to the sub-pixels included in the $n^{th}$ sub-pixel group may be defined as an $n^{th}$ data line. Some of the first to $n^{th}$ data lines DLa1, DLa2, DLa3, or the like may be arranged to detour to the periphery of the component area CA, and the remaining data lines may be spaced from the component area CA and may not be affected by the shape of the component area CA.

For example, the first sub-pixel group PG1 may include a plurality of sub-pixels. In a plan view, a first imaginary line AX1 passing through the sub-pixels constituting the first sub-pixel group PG1 may be located in (at least) the central region of each of the sub-pixels. The first sub-pixel group PG1 may include a plurality of sub-pixels overlapping the first imaginary line AX1 extending in the y direction.

For example, the second sub-pixel group PG2 may include a plurality of sub-pixels. In a plan view, a second imaginary line AX2 passing through the sub-pixels constituting the second sub-pixel group PG2 may be located in (at least) the central region of each of the sub-pixels. The second sub-pixel group PG2 may include a plurality of sub-pixels overlapping the second imaginary line AX2 extending in the y direction.

As such, the $n^{th}$ sub-pixel group may be defined with respect to an $n^{th}$ imaginary line passing through the central region of each of the sub-pixels. The $n^{th}$ sub-pixel group may include a plurality of sub-pixels through which one imaginary line passes in the central region.

At least some of the first imaginary line AX1 to the $n^{th}$ imaginary line may pass through the component area CA in the y-axis direction in a plan view. The first to n-th imaginary lines AX1, AX2, AX3, or the like may be arranged side-by-side and may cross an imaginary center line AX0 extending in the x direction and passing through the center of the component area CA in a plan view. For example, the first to $n^{th}$ imaginary lines AX1, AX2, AX3, or the like may be substantially perpendicular to the imaginary center line AX0.

In a plan view, sub-pixels included in a sub-pixel group defined by an imaginary line passing through the component area CA in the y direction may be arranged at positions other than the component area CA in the display area DA. For example, in order to transmit the data signal to sub-pixels arranged on both sides of the component area CA from among the sub-pixels included in one sub-pixel group, the data line may be arranged to bypass the periphery of the component area CA.

As illustrated in FIG. 8, the display apparatus 1 according to the present embodiment may include the first sub-pixel group PG1 disposed on the substrate 200 and arranged along the first imaginary line AX1 in a plan view. For example, the first imaginary line AX1 may be spaced from the component area CA in a plan view. Unlike the second imaginary line AX2 and the third imaginary line AX3 to be described below, the first imaginary line AX1 does not overlap the component area CA in a plan view.

The display apparatus 1 according to the present embodiment may further include the second sub-pixel group PG2 disposed on the substrate 200 and arranged along the second imaginary line AX2 parallel to the first imaginary line AX1 in a plan view. A portion of the second imaginary line AX2 may be in the component area CA in a plan view.

The display apparatus 1 according to the present embodiment may further include a third sub-pixel group PG3 disposed on the substrate 200 and arranged along the third imaginary line AX3 parallel to the second imaginary line AX2 in a plan view. A portion of the third imaginary line AX3 may be in the component area CA in a plan view and the second imaginary line AX2 may be between the first imaginary line AX1 and the third imaginary line AX3.

As described above, the data driver 150 may be in the peripheral area PA. Specifically, the data driver 150 may be in the second area PA-2 of the peripheral area PA. The data driver 150 may be configured to generate and output data signals for driving the sub-pixels. The data signal output from the data driver 150 may be a time-series dataset including data signals for expressing at least one color from among red (R), green (G), and/or blue (B) colors.

The data signals generated by the data driver 150 may be transmitted to appropriate sub-pixels through appropriate data lines. For example, the dataset generated by the data driver 150 may include one of a first color data signal and a second color data signal. For example, the data driver 150 may be in the peripheral area PA and may be configured to output the dataset including one of the first color data signal and the second color data signal.

Referring to the sub-pixels arranged in a diamond structure, one of the first color data signal and the second color data signal may include time-series data signals indicating the red (R) and blue (B) colors. The other one of the first color data signal and the second color data signal may include time-series data signals indicating the green (G) color.

However, referring to sub-pixels arranged in a non-diamond structure, the first color data signal and the second color data signal may each constitute time-series data signals indicating one color, and the data driver 150 may be configured to additionally generate and output a third color data signal.

The data distributor 170 may be between the display area DA and the data driver 150 in the peripheral area PA.

The data distributor 170 may be connected to the first sub-pixel group PG1 through the first data line DLa1. Similarly, the data distributor 170 may be connected to the second sub-pixel group PG2 through the second data line DLa2 and may be connected to the third sub-pixel group PG3 through the third data line DLa3. In other words, the data distributor 170 may be connected to the $n^{th}$ sub-pixel group through the $n^{th}$ data line.

The data distributor 170 may be configured to transmit the dataset received from the data driver 150 to the first sub-pixel group PG1 to the $n^{th}$ sub-pixel group. As described above, the data distributor 170 may include demultiplexers configured to distribute data to one pair of data lines.

For example, the data distributor 170 may be configured to alternately transmit the first color data signal to the first data line DLa1 and the third data line DLa3. The first sub-pixel group PG1 connected to the first data line DLa1 may be configured to generate light in a wavelength band corresponding to the first color, and the third sub-pixel group PG3 connected to the third data line DLa3 may also be configured to generate light in a wavelength band corresponding to the first color. For example, the first color data signal may include time-series data signals including the green (G) color.

Accordingly, the first data line DLa1 and the third data line DLa3 may be the pair of data lines described above, and the first color data signal may be distributed by the demultiplexers. That is, the first data line DLa1 and the third data line DLa3 may be the pair of data lines. The first color data signal may be alternately transmitted to the first data line DLa1 and the third data line DLa3 by the demultiplexer.

For example, the data distributor 170 may be configured to transmit the second color data signal to the second data line DLa2. In other words, the second sub-pixel group PG2 may be configured to receive the second color data signal through the second data line DLa2. The second color data signal may be a signal that is different from the first color data signal. For example, the second color data signal may include time-series data signals indicating the red (R) and blue (B) colors.

In the present disclosure, the switch may be implemented as a thin-film transistor, as described above with reference to FIG. 5.

As illustrated in FIG. 8, the data distributor 170 may include a first-first switch SW1-1 configured to transmit the first color data signal to the first data line DLa1, and a first-second switch SW1-2 configured to transmit the first color data signal to the third data line DLa3. The first-first switch SW1-1 and the first-second switch SW1-2 may constitute a first-first demultiplexer DMX1-1.

In other words, the demultiplexer included in the display apparatus 1 according to the present embodiment may include two switches. The first color data signal may be distributed through the two switches.

The first switch SW1 of FIG. 6 may be configured to transmit the first color data signal to the sub-pixels connected to each other by the data line, and the second switch SW2 may be configured to transmit the second color data signal to the sub-pixels connected to each other by the data line.

The controller 190 may be configured to generate a control signal for controlling the on/off operation of each of the first-first switch SW1-1 and the first-second switch SW1-2. The control signal generated by the controller 190 may be transmitted from the controller 190 to the first-first switch SW1-1 and the first-second switch SW1-2 through a control signal line.

For example, the controller 190 may be configured to generate a first control signal CLA for the on/off operation of the first-first switch SW1-1. The control signal line may include a first control signal line configured to transmit the first control signal CLA from the controller 190 to the first-first switch SW1-1. The controller 190 may be configured to generate a second control signal CLB for the on/off operation of the first-second switch SW1-2. The control signal line may include a second control signal line configured to transmit the second control signal CLB from the controller 190 to the first-second switch SW1-2.

As illustrated in FIG. 8, the second sub-pixel group PG2 may include a second-first sub-pixel SPX2-1 and a second-second sub-pixel SPX2-2. The second-first sub-pixel SPX2-1 may be on one side of the component area CA in a plan view. The second-second sub-pixel SPX2-2 may be on the other side of the component area CA in a plan view.

For example, the position of the second-first sub-pixel SPX2-1 and the position of the second-second sub-pixel SPX2-2 may be symmetrical with each other with respect to the imaginary center line AX0 that passes through the center of the component area CA in a plan view and crosses the first to third imaginary lines AX1 to AX3.

The display apparatus 1 according to the present embodiment may further include a fourth sub-pixel group PG4 disposed on the substrate 200 and arranged along the fourth imaginary line AX4 parallel to the third imaginary line AX3 in a plan view.

The display apparatus 1 according to the present embodiment may further include the fourth data line DLa4 configured to transmit the data signal to the fourth sub-pixel group PG4. For example, the data distributor 170 may be configured to transmit the second color data signal to the fourth data line DLa4. In other words, the fourth sub-pixel group PG4 may be configured to receive the second color data signal through the fourth data line DLa4. The second color data signal may be a signal that is different from the first color data signal.

The display apparatus 1 according to the present embodiment may further include a fifth sub-pixel group PG5 disposed on the substrate 200 and arranged along the fifth imaginary line AX5 in a plan view. The fifth sub-pixel group PG5 may be configured to receive the first color data signal through the fifth data line DLa5. For example, the first color data signal may include time-series data signals including the green (G) color.

The fifth sub-pixel group PG5 may include at least a fifth-first sub-pixel SPX5-1 and a fifth-second sub-pixel SPX5-2. In a plan view, sub-pixels included in the fifth sub-pixel group PG5 may be spaced from each other by a certain interval in the y direction. However, in a plan view, the sub-pixels included in the fifth sub-pixel group PG5 may not be in the component area CA, and an interval between the fifth-first sub-pixel SPX5-1 on one side of the component area CA and the fifth-second sub-pixel SPX5-2 on the other side of the component area CA may be greater than the certain interval.

The display apparatus 1 according to the present embodiment may further include a sixth sub-pixel group PG6 disposed on the substrate 200 and arranged along the sixth imaginary line AX6 in a plan view. The sixth sub-pixel group PG6 may be configured to receive the second color data signal through the sixth data line DLa6. For example, the second color data signal may include time-series data signals including the red (R) and blue (B) colors.

In a plan view, sub-pixels included in the sixth sub-pixel group PG6 may be spaced from each other by a certain interval in the y-axis direction. For example, when the sub-pixels are arranged in a diamond structure, red (R) color sub-pixels and blue color sub-pixels may be alternately arranged along the sixth imaginary line AX6.

The display apparatus 1 according to the present embodiment may further include a seventh sub-pixel group PG7 disposed on the substrate 200 and arranged along the seventh imaginary line AX7 in a plan view. The seventh sub-pixel group PG7 may be configured to receive the first color data signal through the seventh data line DLa7. For example, the first color data signal may include time-series data signals including the green (G) color. In a plan view, sub-pixels included in the seventh sub-pixel group PG7 may be spaced from each other by a certain interval in the y direction.

The display apparatus 1 according to the present embodiment may further include an eighth sub-pixel group PG8 disposed on the substrate 200 and arranged along the eighth imaginary line AX8 in a plan view. The eighth sub-pixel group PG8 may be configured to receive the second color data signal through the eighth data line DLa8. For example, the second color data signal may include time-series data signals including the red (R) and blue (B) colors.

In a plan view, sub-pixels included in the eighth sub-pixel group PG8 may be spaced from each other by a certain interval in the y direction. For example, when the sub-pixels are arranged in a diamond structure, red color sub-pixels and blue color sub-pixels may be alternately arranged along the eighth imaginary line AX8.

The display apparatus 1 according to the present embodiment may further include an $n^{th}$ sub-pixel group disposed on the substrate 200 and arranged along the $n^{th}$ imaginary line in a plan view. In the present disclosure, the $n^{th}$ sub-pixel group may be defined as a group of sub-pixels configured to receive the data signal through the same data line. In addition, in the present disclosure, the $n^{th}$ sub-pixel group may be defined as a group of sub-pixels arranged along the $n^{th}$ imaginary line extending in the y direction.

As illustrated in FIG. 8, the data distributor 170 may include a first-third switch SW1-3 configured to transmit the second color data signal to the second data line DLa2, and a first-fourth switch SW1-4 configured to transmit the second color data signal to the fourth data line DLa4. In other words, the data distributor 170 may be configured to alternately transmit the second color data signal to the second data line DLa2 and the fourth data line DLa4. To this end, the first-third switch SW1-3 and the first-fourth switch SW1-4 may constitute a first-second demultiplexer DMX1-2.

The controller 190 may be configured to generate a control signal for controlling the on/off operation of each of the first-third switch SW1-3 and the first-fourth switch SW1-4. The control signal generated by the controller 190 may be transmitted from the controller 190 to the first-third switch SW1-3 and the first-fourth switch SW1-4 through a control signal line.

For example, the controller 190 may be configured to generate a control signal for the on/off operation of the first-third switch SW1-3. The generated control signal may be the first control signal CLA described above or may be included in the first control signal CLA. The control signal line may include a first control signal line configured to transmit the first control signal CLA from the controller 190 to the first-third switch SW1-3.

The controller 190 may be configured to generate a control signal for the on/off operation of the first-fourth switch SW1-4. The generated control signal may be the second control signal CLB described above or may be included in the second control signal CLB. The control signal line may include a second control signal line configured to transmit the second control signal CLB from the controller 190 to the first-fourth switch SW1-4.

In other words, the first-first switch SW1-1 and the first-third switch SW1-3 may be connected to the first control signal line, and the first-second switch SW1-2 and the first-fourth switch SW1-4 may be connected to the second control signal line. The control signals for the on/off operations of the first-first switch SW1-1 and the first-third switch SW1-3 may be transmitted through the same line. The control signals for the on/off operations of the first-second switch SW1-2 and the first-fourth switch SW1-4 may be transmitted through the same line. Therefore, the data distributor 170 may be configured to alternately transmit the second color data signal to the second data line DLa2 and the fourth data line DLa4.

As illustrated in FIG. 8, in a plan view, the second data line DLa2 may include a second-first sub-line DLa2-1 configured to electrically connect the second-first sub-pixel SPX2-1 to the data distributor 170. The second-first sub-line DLa2-1 may extend toward the first area PA-1 with respect to the second-first sub-pixel SPX2-1.

The second data line DLa2 may further include a second-second sub-line DLa2-2 extending toward the second area PA-2 with respect to the second-first sub-pixel SPX2-1. The second-second sub-line DLa2-2 may be electrically connected to the first-first sub-line DLa2-1.

In a plan view, the second-second sub-line DLa2-2 may be arranged close to the first data line DLa1 and relatively far from the sixth data line DLa6 or the third data line DLa3. In other words, in a plan view, the distance between the second-second sub-line DLa2-2 and the first data line DLa1 may be less than the distance between the second-second sub-line DLa2-2 and the sixth data line DLa6. In addition, in a plan view, the distance between the second-second sub-line DLa2-2 and the first data line DLa1 may be less than the distance between the second-second sub-line DLa2-2 and the third-second sub-line DLa3-2.

As described above, because the data lines configured to transmit the same data signal are arranged close to each other in a plan view and the data lines configured to transmit different data signals are arranged far from each other in the plan view, data signal distortion due to signal interference may be reduced.

The second data line DLa2 may further include a second-third sub-line DLa2-3 arranged in the second area PA-2 and extending in a direction crossing the first to third imaginary lines AX1 to AX3. The second-third sub-line DLa2-3 may be electrically connected to the second-second sub-line DLa2-2.

The second data line DLa2 may further include a second-fourth sub-line DLa2-4 configured to electrically connect the second-third sub-line DLa2-3 to the second-second sub-pixel SPX2-2. The second-fourth sub-line DLa2-4 may extend toward the second-second sub-pixel SPX2-2 in the second area PA-2.

As illustrated in FIG. 8, the display apparatus according to the present embodiment may include a third sub-pixel group PG3 including a third-first sub-pixel SPX3-1 and a third-second sub-pixel SPX3-2. In this case, the third-first sub-pixel SPX3-1 may be on one side of the component area CA in a plan view, and the third-second sub-pixel SPX3-2 may be on the other side of the component area CA in a plan view.

For example, the position of the third-first sub-pixel SPX3-1 and the position of the third-second sub-pixel SPX3-2 may be symmetrical with each other with respect to the imaginary center line AX0 that passes through the center of the component area CA in a plan view and crosses the first to third imaginary lines AX1 to AX3.

As illustrated in FIG. 8, in a plan view, the third data line DLa3 may include a third-first sub-line DLa3-1 configured to electrically connect the third-first sub-pixel SPX3-1 to the data distributor 170. The third-first sub-line DLa3-1 may extend toward the first area PA-1 with respect to the third-first sub-pixel SPX3-1.

The third data line DLa3 may further include a third-second sub-line DLa3-2 extending toward the second area PA-2 with respect to the third-first sub-pixel SPX3-1. The third-second sub-line DLa3-2 may be electrically connected to the third-first sub-line DLa3-1.

In a plan view, the third-second sub-line DLa3-2 may be arranged close to the sixth data line DLa6 and relatively far from the first data line DLa1 or the third data line DLa3. In other words, in a plan view, the distance between the third-second sub-line DLa3-2 and the sixth data line DLa6 may be less than the distance between the third-second sub-line DLa3-2 and the first data line DLa1. In addition, in a plan view, the distance between the third-second sub-line DLa3-2 and the sixth data line DLa6 may be less than the distance between the third-second sub-line DLa3-2 and the fourth-second sub-line DLa4-2.

As described above, because the data lines configured to transmit the same data signal are arranged close to each other in a plan view and the data lines configured to transmit different data signals are arranged far from each other in the plan view, data signal distortion due to signal interference may be reduced.

The third data line DLa3 may further include a third-third sub-line DLa3-3 arranged in the second area PA-2 and extending in a direction crossing the first to third imaginary lines AX1 to AX3. The third-third sub-line DLa3-3 may be electrically connected to the third-second sub-line DLa3-2.

The third data line DLa3 may further include a third-fourth sub-line DLa3-4 configured to electrically connect the third-third sub-line DLa3-3 to the third-second sub-pixel SPX3-2. The third-fourth sub-line DLa3-4 may extend toward the third-second sub-pixel SPX3-2 in the second area PA-2.

For example, in a plan view, the length of the second-second sub-line DLa2-2 may be less than the length of the third-second sub-line DLa3-2. For example, in a plan view, the length of the second-third sub-line DLa2-3 may be less than the length of the third-third sub-line DLa3-3. For example, in a plan view, the length of the second-fourth sub-line DLa2-4 may be greater than the length of the third-fourth sub-line DLa3-4.

As illustrated in FIG. 8, in a plan view, the fourth data line DLa4 may include a fourth-first sub-line DLa4-1 configured to electrically connect the fourth-first sub-pixel SPX4-1 to the data distributor 170. The fourth-first sub-line DLa4-1 may extend toward the first area PA-1 with respect to the fourth-first sub-pixel SPX4-1.

The fourth data line DLa4 may further include a fourth-second sub-line DLa4-2 extending toward the second area PA-2 with respect to the fourth-first sub-pixel SPX4-1. The fourth-second sub-line DLa4-2 may be electrically connected to the fourth-first sub-line DLa4-1.

In a plan view, the fourth-second sub-line DLa4-2 may be arranged close to the seventh data line DLa7 and relatively far from the sixth data line DLa6 or the fifth data line DLa5. In other words, in a plan view, the distance between the fourth-second sub-line DLa4-2 and the seventh data line DLa7 may be less than the distance between the fourth-second sub-line DLa4-2 and the sixth data line DLa6. In addition, in a plan view, the distance between the fourth-second sub-line DLa4-2 and the seventh data line DLa7 may be less than the distance between the fourth-second sub-line DLa4-2 and the fifth-second sub-line DLa5-2.

As described above, because the data lines configured to transmit the same data signal are arranged close to each other in a plan view and the data lines configured to transmit different data signals are arranged far from each other in the plan view, data signal distortion due to signal interference may be reduced.

The fourth data line DLa4 may further include a fourth-third sub-line DLa4-3 arranged in the second area PA-2 and extending in a direction crossing the first to third imaginary lines AX1 to AX3. The fourth-third sub-line DLa4-3 may be electrically connected to the fourth-second sub-line DLa4-2.

The fourth data line DLa4 may further include a fourth-fourth sub-line DLa4-4 configured to electrically connect the fourth-third sub-line DLa4-3 to the fourth-second sub-pixel SPX4-2. The fourth-fourth sub-line DLa4-4 may extend toward the fourth-second sub-pixel SPX4-2 in the second area PA-2.

For example, in a plan view, the length of the fourth-second sub-line DLa4-2 may be greater than the length of the third-second sub-line DLa3-2. For example, in a plan view, the length of the fourth-third sub-line DLa4-3 may be greater than the length of the third-third sub-line DLa3-3.

For example, in a plan view, the length of the fourth-fourth sub-line DLa4-4 may be less than the length of the third-fourth sub-line DLa3-4.

As illustrated in FIG. 8, in a plan view, the fifth data line DLa5 may include a fifth-first sub-line DLa5-1 configured to electrically connect the fifth-first sub-pixel SPX5-1 to the data distributor 170. The fifth-first sub-line DLa5-1 may extend toward the first area PA-1 with respect to the fifth-first sub-pixel SPX5-1.

The fifth data line DLa5 may further include a fifth-second sub-line DLa5-2 extending toward the second area PA-2 with respect to the fifth-first sub-pixel SPX5-1. The fifth-second sub-line DLa5-2 may be electrically connected to the fifth-first sub-line DLa5-1.

In a plan view, the fifth-second sub-line DLa5-2 may be arranged close to the eighth data line DLa8 and relatively far from the seventh data line DLa7. In other words, in a plan view, the distance between the fifth-second sub-line DLa5-2 and the eighth data line DLa8 may be less than the distance between the fifth-second sub-line DLa5-2 and the seventh data line DLa7.

As described above, because the data lines configured to transmit the same data signal are arranged close to each other in a plan view and the data lines configured to transmit different data signals are arranged far from each other in the plan view, data signal distortion due to signal interference may be reduced.

The fifth data line DLa5 may further include a fifth-third sub-line DLa5-3 arranged in the second area PA-2 and extending in a direction crossing the first to third imaginary lines AX1 to AX3. The fifth-third sub-line DLa5-3 may be electrically connected to the fifth-second sub-line DLa5-2.

The fifth data line DLa5 may further include a fifth-fourth sub-line DLa5-4 configured to electrically connect the fifth-third sub-line DLa5-3 to the fifth-second sub-pixel SPX5-2. The fifth-fourth sub-line DLa5-4 may extend toward the fifth-second sub-pixel SPX5-2 in the second area PA-2.

For example, in a plan view, the length of the fifth-second sub-line DLa5-2 may be greater than the length of the fourth-second sub-line DLa4-2. For example, in a plan view, the length of the fifth-third sub-line DLa5-3 may be greater than the length of the fourth-third sub-line DLa4-3. For example, in a plan view, the length of the fifth-fourth sub-line DLa5-4 may be greater than the length of the fourth-fourth sub-line DLa4-4.

As illustrated in FIG. 8, the sixth data line DLa6 may extend in a direction parallel to the sixth imaginary line AX6 in a plan view. The sixth data line DLa6 may be between the third-second sub-line DLa3-2 and the fourth-second sub-line DLa4-2 in a plan view. The sixth data line DLa6 may be configured to transmit the data signal to the sixth sub-pixel group PG6 between the third-second sub-line DLa3-2 and the fourth-second sub-line DLa4-2.

As illustrated in FIG. 8, the seventh data line DLa7 may extend in a direction parallel to the seventh imaginary line AX7 in a plan view. The seventh data line DLa7 may be between the fourth-second sub-line DLa4-2 and the fifth-second sub-line DLa5-2 in a plan view. The seventh data line DLa7 may be configured to transmit the data signal to the seventh sub-pixel group PG7 between the fourth-second sub-line DLa4-2 and the fifth-second sub-line DLa5-2.

As illustrated in FIG. 8, the eighth data line DLa8 may extend in a direction parallel to the eighth imaginary line AX8 in a plan view. The eighth data line DLa8 may be around the fifth-second sub-line DLa5-2 in a plan view, and the fifth-second sub-line DLa5-2 may be between the eighth data line DLa8 and the seventh data line DLa7. The eighth data line DLa8 may be configured to transmit the data signal to the eighth sub-pixel group PG8 between the fifth-second sub-line DLa5-2 and the seventh sub-line DLa7.

As illustrated in FIG. 8, in a plan view, the $n^{th}$ data line may be classified into a data line (case 1) connected to the sub-pixel group arranged along the imaginary line passing through the component area CA, and a data line (case 2) connected to the sub-pixel group arranged along the imaginary line not passing through the component area CA.

In case 1, the $n^{th}$ data line may have a configuration to bypass the periphery of the component area CA in a plan view. In case 1, the $n^{th}$ data line may include a plurality of sub-lines. For example, the $n^{th}$ data line may include a sub-line passing between other data lines in order not to overlap the component area CA, a sub-line arranged in the second area PA-2 of the peripheral area PA.

In case 2, the $n^{th}$ data line may be spaced from the component area CA in a plan view and may be arranged along the $n^{th}$ sub-pixel group in order to transmit the data signal.

As illustrated in FIG. 8, because the data lines configured to transmit the same data signal are arranged adjacent to each other, the influence of signal interference occurring on the peripheral lines while transmitting the data signal may be reduced or minimized. For example, the seventh data line DLa7 configured to transmit the first color data signal and the fourth data line DLa4 (in particular, the fourth-second sub-line DLa4-2) configured to transmit the first color data signal may be arranged adjacent to each other, and the eighth data line DLa8 configured to transmit the second color data signal and the fifth data line DLa5 (in particular, the fifth-second sub-line DLa5-2) configured to transmit the second color data signal may be arranged adjacent to each other. In addition, the seventh data line DLa7 and the fourth-second sub-line DLa4-2 configured to transmit the first color data signal may be arranged relatively far apart from the eighth data line DLa8 and the fifth-second sub-line DLa5-2 configured to transmit the second color data signal.

Figure 9:
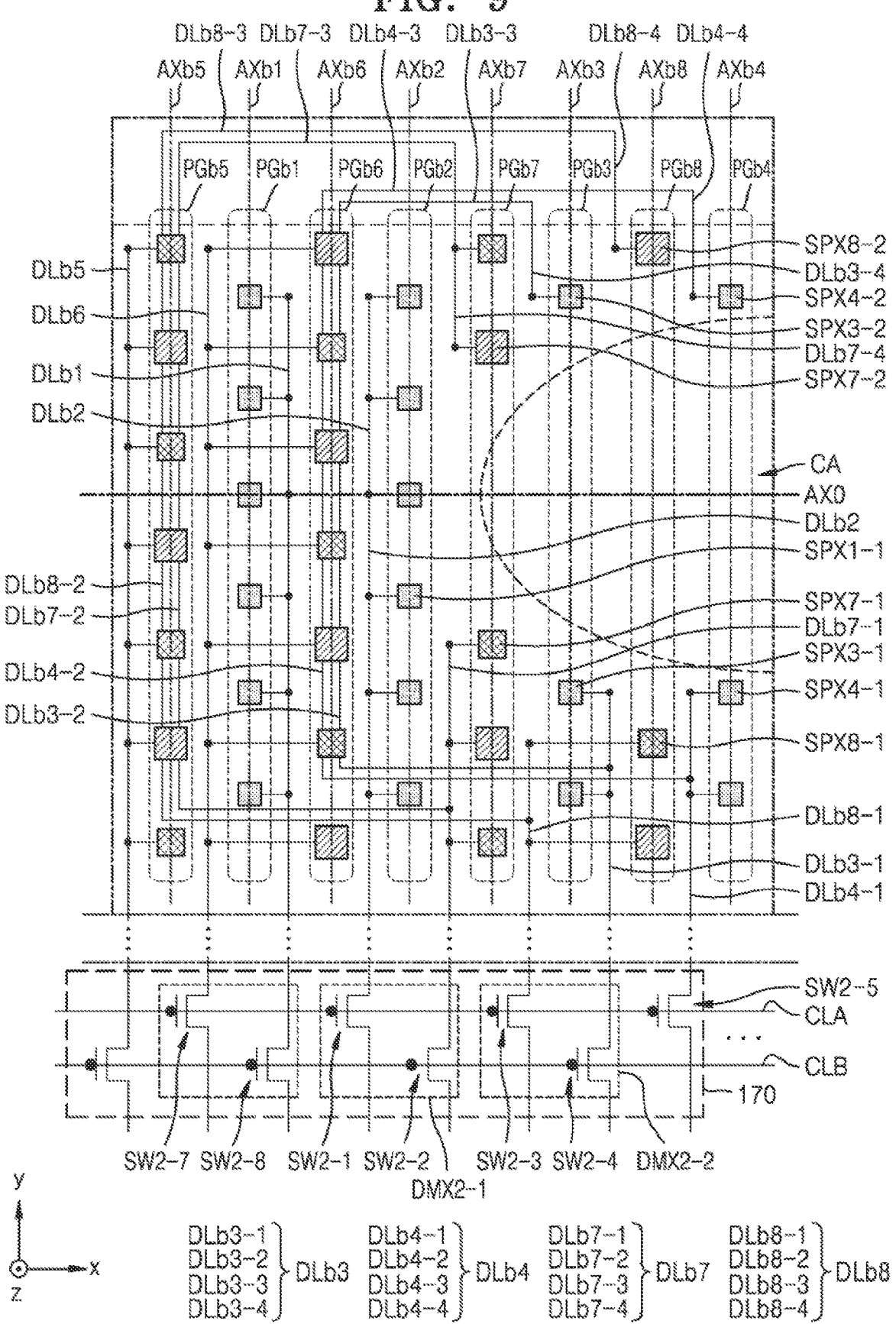
FIG. 9 is a conceptual diagram schematically illustrating a pixel structure and a wiring structure around a component area of the display apparatus of FIG. 1, according to one or more embodiments.

FIG. 9 is a conceptual diagram schematically illustrating a pixel structure and a wiring structure around the component area CA of the display apparatus of FIG. 1, according to one or more embodiments. In the following description of FIG. 9, the same or redundant description as provided above are omitted.

For reference, sub-pixels of FIG. 9 are arranged in a diamond structure, but this is only an example shown to easily express wirings for convenience of description and illustration. Even when the sub-pixels are arranged in a different arrangement unlike as illustrated in FIG. 9, it is obvious that wirings may be arranged to have technical features to be described below.

For reference, the display area DA including more than half of the component area CA, a portion of the first area PA-1 of the peripheral area PA, and a portion of the second area PA-2 of the peripheral area PA are illustrated in FIG. 9, but for convenience of description, an area between the display area DA and the second area PA-2 of the peripheral area PA may be omitted.

Hereinafter, a "plurality of sub-pixels' in the description of the embodiment of FIG. 9 may be understood as the same meaning as the "sub-pixel group" described above, an 'imaginary line' in the description of the embodiment of FIG. 9 may be understood as the same meaning as the "imaginary line" described above, and a "line" may be understood as the same meaning as the "data line" in the description of the embodiment of FIG. 9.

The display apparatus according to the present embodiment may include a substrate 200. The substrate 200 may include the component area CA, the display area DA surrounding the component area CA, and the peripheral area PA outside the display area DA.

The display apparatus according to the present embodiment may include a plurality of first sub-pixels PGb1 disposed on the substrate 200 and arranged along a first imaginary line AXb1 in a plan view.

The display apparatus according to the present embodiment may include a plurality of second sub-pixels PGb2 disposed on the substrate 200 and arranged along a second imaginary line AXb2 parallel to the first imaginary line AXb1 in a plan view.

The display apparatus according to the present embodiment may include a plurality of third sub-pixels PGb3 disposed on the substrate 200 and arranged along a third imaginary line AXb3 parallel to the second imaginary line AXb2 in a plan view.

In a plan view, a portion of the third imaginary line AXb3 may be in the component area CA, and the second imaginary line AXb2 may be between the first imaginary line AXb1 and the third imaginary line AXb3.

The display apparatus according to the present embodiment may include a data driver 150 configured to output a dataset including one of a first color data signal and a second color data signal.

The display apparatus according to the present embodiment may include a data distributor 170 configured to transmit the dataset received from the data driver 150 to the first sub-pixels PGb1 to the third sub-pixels PGb3.

The display apparatus according to the present embodiment may include a first line DLb1 configured to transmit the first color data signal from the data distributor 170 to the first sub-pixels PGb1, a second line DLb2 configured to transmit the first color data signal from the data distributor 170 to the second sub-pixels PGb2, and a third line DLb3 configured to transmit the first color data signal from the data distributor 170 to the third sub-pixels PGb3.

For example, in a plan view, a portion of the third line DLb3 may be between the first line DLb1 and the second line DLb2.

The display apparatus according to the present embodiment may further include a plurality of fourth sub-pixels PGb4 disposed on the substrate 200 and arranged along a fourth imaginary line AXb4 parallel to the third imaginary line AXb3 in a plan view. In a plan view, a portion of the fourth imaginary line AXb4 may be in the component area CA, and the third imaginary line AXb3 may be between the second imaginary line AXb2 and the fourth imaginary line AXb4.

The display apparatus according to the present embodiment may further include a fourth line DLb4 configured to transmit the first color data signal from the data distributor 170 to the fourth sub-pixels PGb4. For example, in a plan view, a portion of the fourth line DLb4 may be between the first line DLb1 and the second line DLb2. In a plan view, a portion of the fourth line DLb4 may be between the first line DLb1 and the second line DLb2.

As illustrated in FIG. 9, in a plan view, the third line DLb3 may include a third-first unit line DLb3-1 configured to electrically connect a third-first sub-pixel SPX3-1 to the data distributor 170. The third-first unit line DLb3-1 may extend toward the first area PA-1 with respect to the third-first sub-pixel SPX3-1.

The third line DLb3 may further include a third-second unit line DLb3-2 extending toward the second area PA-2 with respect to the third-first unit line DLb3-1. The third-second unit line DLb3-2 may be electrically connected to the third-first unit line DLb3-1. Specifically, the third-second unit line DLb3-2 may be between the first line DLb1 and the second line DLb2 in a plan view.

The third line DLb3 may further include a third-third unit line DLb3-3 arranged in the second area PA-2 and extending in a direction crossing first to third imaginary lines AXb1 to AXb3. The third-third unit line DLb3-3 may be electrically connected to the third-second unit line DLb3-2.

The third line DLb3 may further include a third-fourth unit line DLb3-4 configured to electrically connect the third-third unit line DLb3-3 to the third-second unit line DLb3-2. The third-fourth unit line DLb3-4 may extend toward the third-second sub-pixel SPX3-2 in the second area PA-2.

As illustrated in FIG. 9, in a plan view, the fourth line DLb4 may include a fourth-first unit line DLb4-1 configured to electrically connect a fourth-first sub-pixel SPX4-1 to the data distributor 170. The fourth-first unit line DLb4-1 may extend toward the first area PA-1 with respect to the fourth-first sub-pixel SPX4-1.

The fourth line DLb4 may further include a fourth-second unit line DLb4-2 extending toward the second area PA-2 with respect to the fourth-first unit line DLb4-1. The fourth-second unit line DLb4-2 may be electrically connected to the fourth-first unit line DLb4-1. Specifically, the fourth-second unit line DLb4-2 may be between the first line DLb1 and the second line DLb2 in a plan view. Specifically, the fourth-second unit line DLb4-2 may be between the first line DLb1 and the third-second unit line DLb3-2 in a plan view.

The fourth line DLb4 may further include a fourth-third unit line DLb4-3 arranged in the second area PA-2 and extending in a direction crossing the first to third imaginary lines AXb1 to AXb3. The fourth-third unit line DLb4-3 may be electrically connected to the fourth-second unit line DLb4-2.

The fourth line DLb4 may further include a fourth-fourth unit line DLb4-4 configured to electrically connect the fourth-third unit line DLb4-3 to the fourth-second sub-pixel SPX4-2. The fourth-fourth unit line DLb4-4 may extend toward the fourth-second sub-pixel SPX4-2 in the second area PA-2.

For example, in a plan view, the length of the fourth-second unit line DLb4-2 may be greater than the length of the third-second unit line DLb3-2. In a plan view, the length of the fourth-third unit line DLb4-3 may be greater than the length of the third-third unit line DLb3-3.

In other words, the first to fourth sub-pixels PGb1 to PGb4 may each include sub-pixels configured to receive the first color data signal. Accordingly, the first to fourth lines DLb1 to DLb4 may be respectively configured to transmit the first color data signal to the first to fourth sub-pixels PGb1 to PGb4. Accordingly, because the first to fourth lines DLb1 to DLb4 configured to transmit the same data signal are arranged close to each other, the influence of signal interference occurring when the signal passes through the line may be reduced or minimized.

The display apparatus according to the present embodiment may include a fifth line DLb5 configured to transmit the second color data signal from the data distributor 170 to the fifth sub-pixels PGb5, a sixth line DLb6 configured to transmit the second color data signal from the data distributor 170 to the sixth sub-pixels PGb6, and a seventh line DLb7 configured to transmit the second color data signal from the data distributor 170 to the seventh sub-pixels PGb7.

For example, in a plan view, a portion of the seventh line DLb7 may be between the fifth line DLb5 and the sixth line DLb6.

The display apparatus according to the present embodiment may further include a plurality of eighth sub-pixels PGb8 disposed on the substrate 200 and arranged along an eighth imaginary line AXb8 parallel to the third imaginary line AXb3 in a plan view. In a plan view, a portion of the eighth imaginary line AXb8 may be spaced from the component area CA and may not overlap the component area CA.

The display apparatus according to the present embodiment may further include an eighth line DLb8 configured to transmit the second color data signal from the data distributor 170 to the eighth sub-pixels PGb8. For example, in a plan view, a portion of the eighth line DLb8 may be between the fifth line DLb5 and the sixth line DLb6. In a plan view, a portion of the eighth line DLb8 may be between the fifth line DLb5 and the seventh line DLb7.

As illustrated in FIG. 9, in a plan view, the seventh line DLb7 may include a seventh-first unit line DLb7-1 configured to electrically connect a seventh-first sub-pixel SPX7-1 to the data distributor 170. The seventh-first unit line DLb7-1 may extend toward the first area PA-1 with respect to the seventh-first sub-pixel SPX7-1.

The seventh line DLb7 may further include a seventh-second unit line DLb7-2 extending toward the second area PA-2 with respect to the seventh-first unit line DLb7-1. The seventh-second unit line DLb7-2 may be electrically connected to the seventh-first unit line DLb7-1. Specifically, the seventh-second unit line DLb7-2 may be between the fifth line DLb5 and the sixth line DLb6 in a plan view.

The seventh line DLb7 may further include a seventh-third unit line DLb7-3 arranged in the second area PA-2 and extending in a direction crossing the first to third imaginary lines AXb1 to AXb3. The seventh-third unit line DLb7-3 may be electrically connected to the seventh-second unit line DLb7-2.

The seventh line DLb7 may further include a seventh-fourth unit line DLb7-4 configured to electrically connect the seventh-third unit line DLb7-3 to the seventh-second sub-pixel SPX7-2. The seventh-fourth unit line DLb7-4 may extend toward the seventh-second sub-pixel SPX7-2 in the second area PA-2.

As illustrated in FIG. 9, in a plan view, the eighth line DLb8 may include an eighth-first unit line DLb8-1 configured to electrically connect an eighth-first sub-pixel SPX8-1 to the data distributor 170. The eighth-first unit line DLb8-1 may extend toward the first area PA-1 with respect to the eighth-first sub-pixel SPX8-1.

The eighth line DLb8 may further include an eighth-second unit line DLb8-2 extending toward the second area PA-2 with respect to the eighth-first unit line DLb8-1. The eighth-second unit line DLb8-2 may be electrically connected to the eighth-first unit line DLb8-1. Specifically, the eighth-second unit line DLb8-2 may be between the fifth line DLb5 and the sixth line DLb6 in a plan view. Specifically, the eighth-second unit line DLb8-2 may be between the fifth line DLb5 and the seventh-second unit line DLb7-2 in a plan view.

The eighth line DLb8 may further include an eighth-third unit line DLb8-3 arranged in the second area PA-2 and extending in a direction crossing the first to third imaginary lines AXb1 to AXb3. The eighth-third unit line DLb8-3 may be electrically connected to the eighth-second unit line DLb8-2.

The eighth line DLb8 may further include an eighth-fourth unit line DLb8-4 configured to electrically connect the eighth-third unit line DLb8-3 to the eighth-second sub-pixel SPX8-2. The eighth-fourth unit line DLb8-4 may extend toward the eighth-second sub-pixel SPX8-2 in the second area PA-2.

For example, in a plan view, the length of the eighth-second unit line DLb8-2 may be greater than the length of the seventh-second unit line DLb7-2. In a plan view, the length of the eighth-third unit line DLb8-3 may be greater than the length of the seventh-third unit line DLb7-3.

In other words, the fifth to eighth sub-pixels PGb5 to PGb8 may each include sub-pixels configured to receive the second color data signal. Accordingly, the fifth to eighth lines DLb5 to DLb8 may be respectively configured to transmit the first color data signal to the fifth to eighth sub-pixels PGb5 to PGb8. Accordingly, because the fifth to eighth lines DLb5 to DLb8 configured to transmit the same data signal are arranged close to each other, the influence of signal interference occurring when the signal passes through the line may be reduced or minimized.

As illustrated in FIG. 9, the seventh-third unit line DLb7-3 and the eighth-third unit line DLb8-3 may be arranged side-by-side in the second area PA-2. The seventh-third unit line DLb7-3 and the eighth-third unit line DLb8-3 may be configured to transmit the same data signal (e.g., the second color data signal).

The fourth-third unit line DLb4-3 and the third-third unit line DLb3-3 may be arranged side-by-side in the second area PA-2. The fourth-third unit line DLb4-3 and the third-third unit line DLb3-3 may be configured to transmit the same data signal (e.g., the first color data signal).

For example, in a plan view, the distance between the seventh-third unit line DLb7-3 and the eighth-third unit line DLb8-3 may be referred to as a first distance. In addition, in a plan view, the distance between the unit line arranged close to the display area DA from among the seventh-third unit line DLb7-3 and the eighth-third unit line DLb8-3 and the unit line arranged farther from the display area DA between the fourth-third unit line DLb4-3 and the third-third unit line DLb3-3 may be referred to as a second distance. In this case, the first distance may be less than the second distance. As a result, the influence of signal interference that may occur between the first color data signal and the second color data signal may be reduced or minimized.

For example, in a plan view, the distance between the fourth-third unit line DLb4-3 and the third-third unit line DLb3-3 may be referred to as a third distance. In this case, the third distance may be less than the second distance. As a result, the influence of signal interference that may occur between the first color data signal and the second color data signal may be reduced or minimized.

In addition, in the display apparatus illustrated in FIG. 9, BRS lines (the third line DLb3, the fourth line DLb4, the seventh line DLb7, and the eighth line DLb8 each including a plurality of unit lines in order to avoid interference with the component area CA) configured to transmit the same data signal (e.g., the first color data signal) may be between the lines configured to transmit the same data signal (e.g., the first color data signal). As a result, the BRS lines and the data lines arranged adjacent to each other in the display area DA are configured to transmit the same data signal, and the signal interference effect may be reduced or minimized between the BRS lines (the third-third unit line DLb3-3, the fourth-third unit line DLb4-3, the seventh-third unit line DLb7-3, and the eighth-third unit line DLb8-3) passing through the second area PA-2 of the peripheral area PA.

US 12,614,514 B2

33

Figure 10:
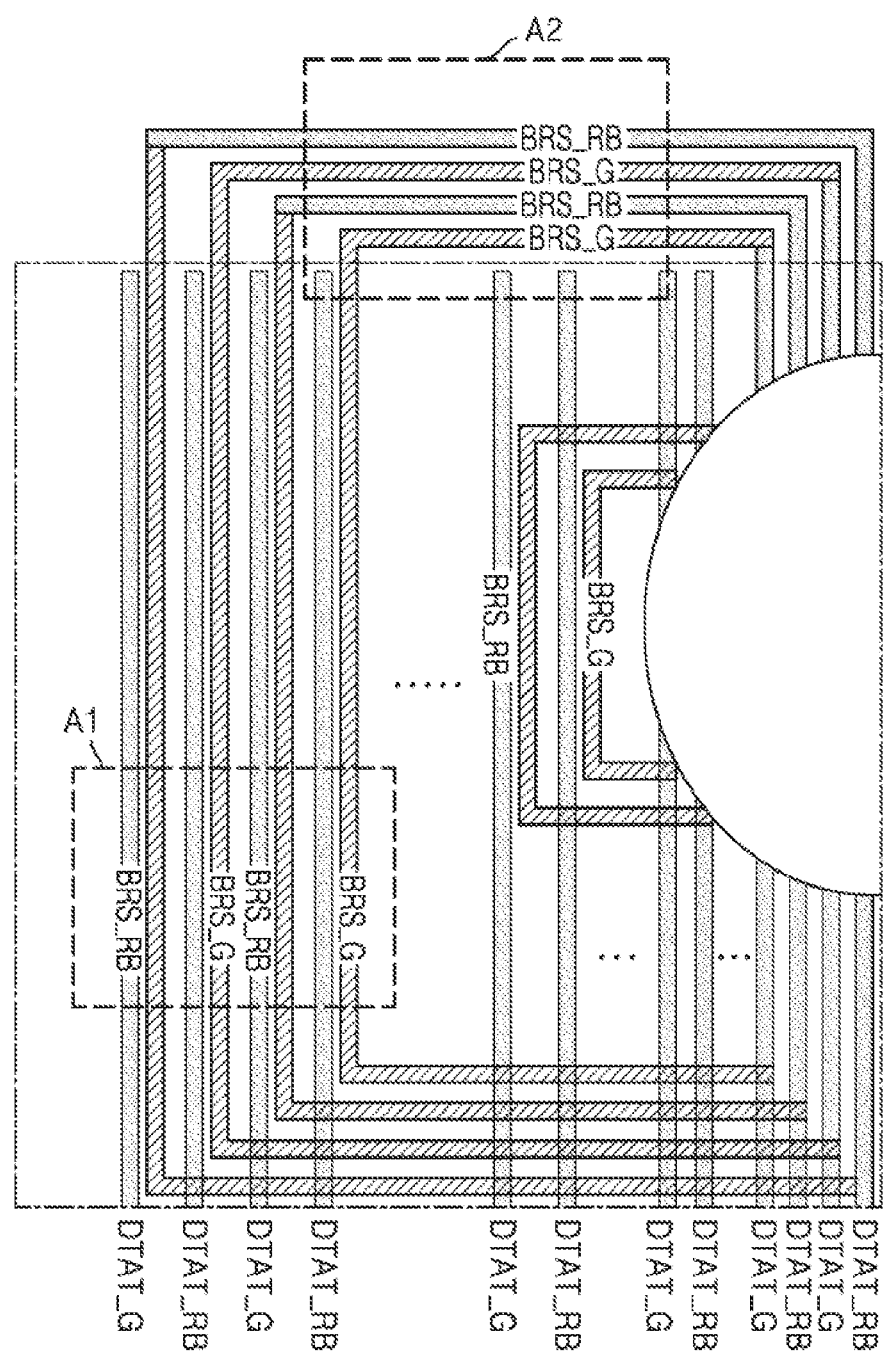
FIG. 10 is a conceptual diagram schematically illustrating data lines of a display apparatus according to a comparative example.
Figure 11:
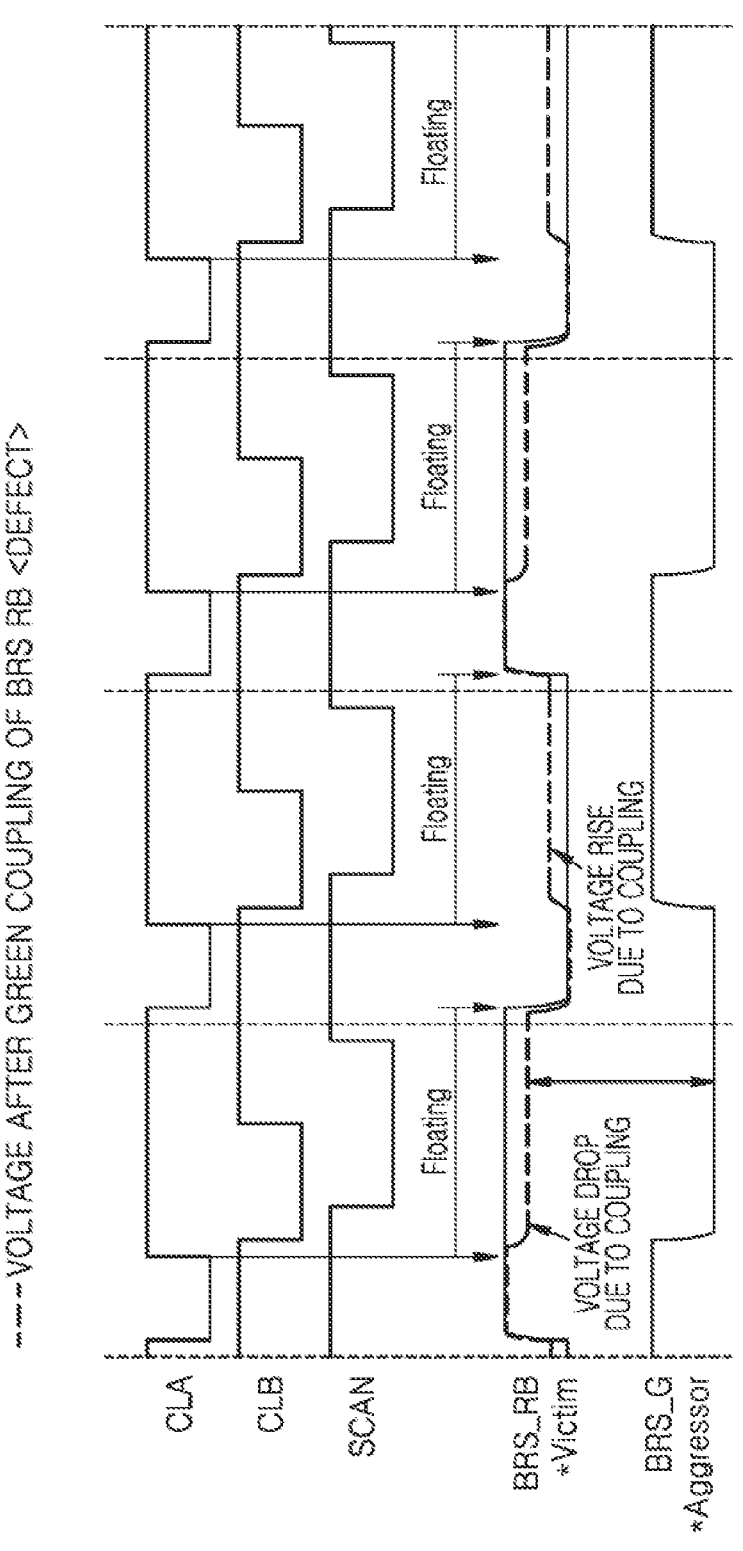
FIG. 11 is a timing diagram schematically illustrating signal changes due to signal interference in the display apparatus according to the comparative example.

FIG. 10 is a conceptual diagram schematically illustrating data lines of a display apparatus according to a comparative example, and FIG. 11 is a timing diagram schematically illustrating signal changes due to signal interference in the display apparatus according to the comparative example.

As illustrated in FIG. 10, referring to an area A1 of the display apparatus according to the comparative example, it is confirmed that a line DATA_G and a line DATA_RB are arranged adjacent to each other. In addition, referring to an area A2 of the display apparatus according to the comparative example, it is confirmed that a line BRS_RB and a line BRS_G are arranged adjacent to each other. As described above, the line DATA_G and line BRS_G are configured to transmit a first color data signal such as a green (G) color. As described above, the line DATA_RB and the line BRS_RB are configured to transmit a second color data signal such as red (R) and blue (B) colors.

As illustrated in FIG. 11, when the lines configured to transmit different data signals are arranged adjacent to each other, the data signal of the line BRS_RB may be affected by the data signal of the line BRS_G. The same applies to the opposite case, and the same applies the lines DATA_G and DATA_RB.

In particular, as illustrated in FIG. 11, after the first control signal CLA provided to the data distributor 170 is turned off, the data signal of the data line connected to the switch turned off by the first control signal becomes a floating state. That is, when the data distributor 170 is connected, the time at which the data signal is temporarily in a floating state occurs. When the data signal is in the floating state, it is more vulnerable to interference with surrounding DATA signals. Accordingly, data signal interference may adversely affect image quality. For example, a Mura phenomenon may occur due to interference with a DATA signal around the component area or camera hole.

Figure 12:
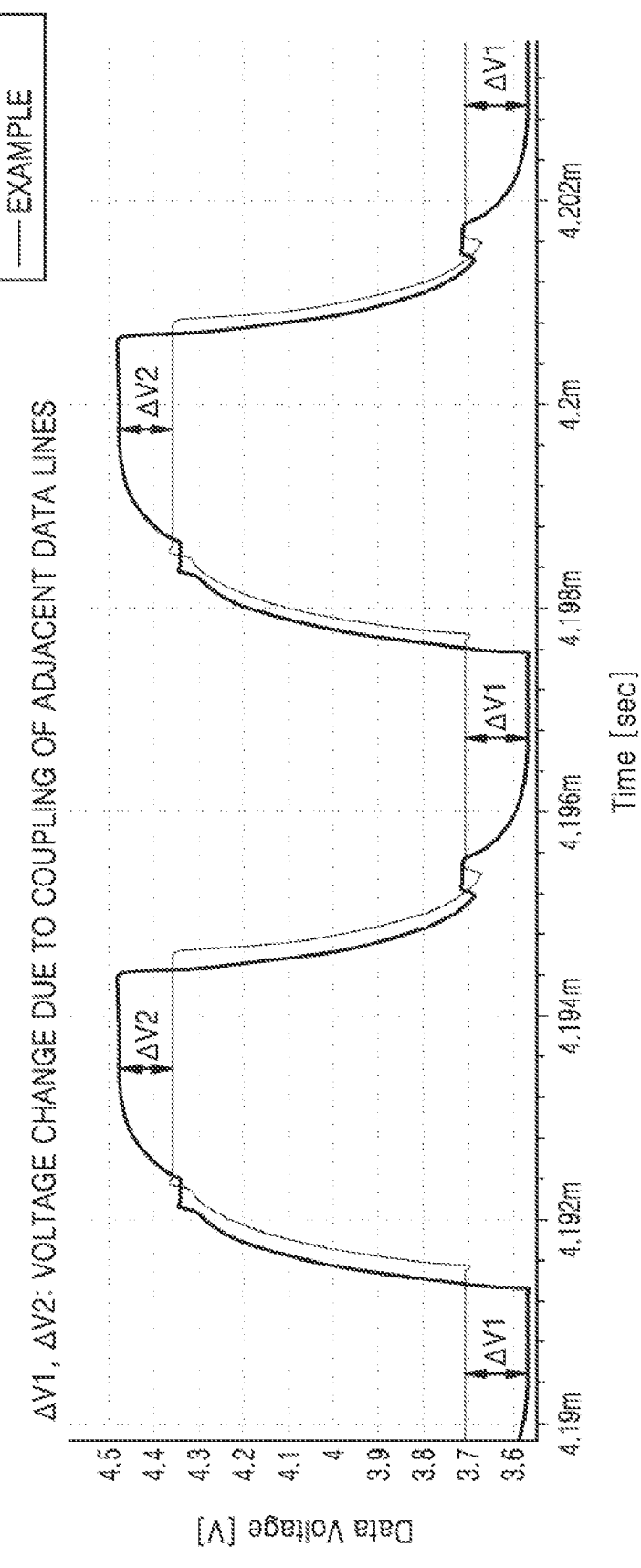
FIG. 12 is a graph showing comparison of signal interference between the comparative example of FIG. 10 and the example of FIG. 8 or FIG. 9.

FIG. 12 is a graph showing comparison of signal interference between the comparative example of FIG. 10 and the example of FIG. 8 or 9.

As illustrated in FIG. 12, the voltage change when the data lines are arranged adjacent to each other as in the comparative example of FIG. 10 may be greater than the voltage change when the data lines or wirings are arranged adjacent to each other as in the example of FIG. 8 or 9. When configuring the BRS circuit, the design in which the data lines or wirings configured to transmit the same data signal (e.g., the first color data signal) are arranged adjacent to each other is more advantageous than the comparative example in terms of data signal interference.

As described above, in order to prevent signal interference occurring in the floating state that may occur in the line configured to transmit the data signal when the data distributor 170 is connected, the present disclosure proposes a method of adjacent arrangement of the lines connected to the data distributor 170 and configured to transmit the data signals having the same or similar waveforms.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

34

What is claimed is:

1. A display apparatus comprising:
a substrate comprising a component area, a display area around the component area, and a peripheral area outside the display area;
a first sub-pixel group on the substrate and arranged along a first imaginary line in a plan view;
a second sub-pixel group on the substrate and arranged along a second imaginary line parallel to the first imaginary line in a plan view, a portion of the second imaginary line being arranged in the component area in a plan view;
a third sub-pixel group on the substrate and arranged along a third imaginary line parallel to the second imaginary line in a plan view, a portion of the third imaginary line being arranged in the component area in a plan view and the second imaginary line being between the first imaginary line and the third imaginary line in a plan view;
a sixth sub-pixel group on the substrate and arranged along a sixth imaginary line parallel to the first imaginary line in a plan view;
a data driver arranged in the peripheral area and configured to output a dataset comprising one of a first color data signal or a second color data signal to output lines;
a data distributor configured to transmit the dataset received from the data driver to the first sub-pixel group, the second sub-pixel group, and the third sub-pixel group;
a controller configured to generate a first control signal and a second control signal;
a first data line configured to connect the data distributor to the first sub-pixel group;
a second data line configured to connect the data distributor to the second sub-pixel group, the second data line comprising a second-first sub-line, a second-third sub-line, and a second-second sub-line connecting the second-first sub-line and the second-third sub-line bypassing the component area;
a third data line configured to connect the data distributor to the third sub-pixel group, the third data line comprising a third-first sub-line, a third-third sub-line and a third-second sub-line connecting the third-first sub-line and the third-third sub-line bypassing the component area, and
a sixth data line configured to connect the data distributor to the sixth sub-pixel group,
wherein the data distributor is further configured to;
electrically connect the first data line and the second data line to respective corresponding output lines based on the first control signal, electrically connect the third data line to a corresponding output line based on the second control signal, and alternately transmit the first color data signal to the first data line and the third data line;
electrically connect the sixth data line to corresponding output line based on the second control signal, and
wherein the first data line is closer to the second-second sub-line than the third-second sub-line.

2. The display apparatus of claim 1, wherein the data distributor comprises:
a first-first switch configured to transmit the first color data signal to the first data line; and
a first-second switch configured to transmit the first color data signal to the third data line.

3. The display apparatus of claim 2, further comprising:

a first control signal line configured to transmit the first control signal from the controller to the first-first switch; and a second control signal line configured to transmit the second control signal from the controller to the first-second switch, wherein the controller configured to generate the first control signal and the second control signal for controlling an on/off operation of the first-first switch and the first-second switch, respectively.

4. The display apparatus of claim 3, wherein the data distributor further comprises a first-third switch configured to transmit the second color data signal to the second data line, and wherein the first control signal line is further configured to transmit the first control signal from the controller to the first-third switch.

5. The display apparatus of claim 4, wherein the third-second sub-line is arranged adjacent to the sixth data line.

6. The display apparatus of claim 1, wherein the data distributor is between the display area and the data driver in the peripheral area.

7. The display apparatus of claim 1, wherein the first imaginary line is spaced from the component area in a plan view.

8. The display apparatus of claim 2, wherein the second sub-pixel group is configured to receive the second color data signal through the second data line.

9. The display apparatus of claim 1, wherein the second sub-pixel group comprises a second-first sub-pixel and a second-second sub-pixel, wherein the second-first sub-pixel is on one side of the component area in a plan view, and wherein the second-second sub-pixel is on another side of the component area in a plan view.

10. The display apparatus of claim 9, wherein a position of the second-first sub-pixel and a position of the second-second sub-pixel are symmetrical with each other with respect to an imaginary center line that passes through a center of the component area in a plan view and crosses the first to third imaginary lines.

11. The display apparatus of claim 5, further comprising:

a fourth sub-pixel group on the substrate and arranged along a fourth imaginary line parallel to the third imaginary line in a plan view, a portion of the fourth imaginary line being arranged in the component area in a plan view and the third imaginary line being between the second imaginary line and the fourth imaginary line in a plan view; and a fourth data line configured to connect the data distributor to the fourth sub-pixel group.

12. The display apparatus of claim 11, wherein the data distributor is further configured to alternately transmit the second color data signal to the second data line and the fourth data line.

13. The display apparatus of claim 12, wherein the data distributor further comprises a first-fourth switch configured to transmit the second color data signal to the fourth data line.

14. The display apparatus of claim 13, wherein the controller is further configured to control an on/off operation of the first-third switch by using the first control signal and to control an on/off operation of the first-fourth switch by using the second control signal.

15. The display apparatus of claim 14, wherein the first control signal line is connected to the first-first switch and the first-third switch, and wherein the second control signal line is connected to the first-second switch and the first-fourth switch.

16. The display apparatus of claim 9, wherein the peripheral area comprises:

a first area in which the data driver is located; and a second area located on an opposite side of the first area with respect to the display area.

17. The display apparatus of claim 16, wherein, in a plan view, the second data line further comprises a second-fourth sub-line connected to the second-third sub-line, wherein the second-first sub-line configured to electrically connect the second-first sub-pixel to the data distributor and extending toward the first area with respect to the second-first sub-pixel;

the second-second sub-line extending toward the second area with respect to the second-first sub-pixel and electrically connected to the second-first sub-line;

the second-third sub-line arranged in the second area, extending in a direction crossing the first to third imaginary lines, and electrically connected to the second-second sub-line; and the second-fourth sub-line configured to electrically connect the second-third sub-line to the second-second sub-pixel and extending toward the second-second sub-pixel in the second area.

18. The display apparatus of claim 17, wherein the third sub-pixel group comprises a third-first sub-pixel and a third-second sub-pixel, wherein the third-first sub-pixel is on one side of the component area in a plan view, and wherein the third-second sub-pixel is on another side of the component area in a plan view.

19. The display apparatus of claim 18, wherein a position of the third-first sub-pixel and a position of the third-second sub-pixel are symmetrical with each other with respect to an imaginary center line that passes through a center of the component area in a plan view and crosses the first to third imaginary lines.

20. The display apparatus of claim 18, wherein, in a plan view, the third data line further comprises a third-fourth sub-line connected to the third-third sub-line;

wherein the third-first sub-line configured to electrically connect the third-first sub-pixel to the data distributor and extending toward the first area with respect to the third-first sub-pixel;

the third-second sub-line extending toward the second area with respect to the third-first sub-pixel and electrically connected to the third-first sub-line;

the third-third sub-line arranged in the second area, extending in a direction crossing the first to third imaginary lines, and electrically connected to the third-second sub-line; and the third-fourth sub-line configured to electrically connect the third-third sub-line to the third-second sub-pixel and extending toward the third-second sub-pixel in the second area.

21. The display apparatus of claim 20, wherein, in a plan view, a length of the second-second sub-line is greater than a length of the third-second sub-line.

22. The display apparatus of claim 20, wherein, in a plan view, a length of the second-third sub-line is greater than a length of the third-third sub-line.

23. The display apparatus of claim 20, wherein, in a plan view, a length of the second-fourth sub-line is greater than a length of the third-fourth sub-line.

24. A display apparatus comprising:

a substrate comprising a component area, a display area around the component area, and a peripheral area outside the display area;

a plurality of first sub-pixels on the substrate and arranged along a first imaginary line in a plan view;

a plurality of second sub-pixels on the substrate and arranged along a second imaginary line parallel to the first imaginary line in a plan view;

a plurality of third sub-pixels on the substrate and arranged along a third imaginary line parallel to the second imaginary line in a plan view, a portion of the third imaginary line being arranged in the component area in a plan view and the second imaginary line being between the first imaginary line and the third imaginary line in a plan view;

a plurality of fourth sub-pixels on the substrate and arranged along a fourth imaginary line parallel to the third imaginary line in a plan view, a portion of the fourth imaginary line being arranged in the component area in a plan view and the third imaginary line being between the second imaginary line and the fourth imaginary line in a plan view;

a plurality of fifth sub-pixels on the substrate and arranged along a fifth imaginary line parallel to the first imaginary line in a plan view;

a data driver arranged in the peripheral area and configured to output a dataset comprising one of a first color data signal or a second color data signal;

a data distributor configured to transmit the dataset received from the data driver to the plurality of first sub-pixels, the plurality of second sub-pixels, and the plurality of third sub-pixels and the plurality of fourth sub-pixels;

a first line configured to transmit the first color data signal from the data distributor to the plurality of first sub-pixels;

a second line configured to transmit the first color data signal from the data distributor to the plurality of second sub-pixels;

a third line configured to transmit the first color data signal from the data distributor to the plurality of third sub-pixels;

a fourth line configured to transmit the first color data signal from the data distributor to the plurality of fourth sub-pixels;

a fifth data line configured to connect the data distributor to the plurality of fifth sub-pixels; and in a plan view, a portion of the third line is between the first line and the second line, and a portion of the fourth line is between the first line and the second line, wherein the data distributor is further configured to electrically connect the fifth data line to corresponding output line based on a second control signal.

25. The display apparatus of claim 24, wherein, in a plan view, a portion of the fourth line is between the first line and the third line.

26. A display apparatus comprising:

a substrate comprising a component area, a display area around the component area, and a peripheral area outside the display area;

a first sub-pixel group on the substrate and arranged along a first imaginary line in a plan view;

a second sub-pixel group on the substrate and arranged along a second imaginary line parallel to the first imaginary line in a plan view, a portion of the second imaginary line being arranged in the component area in a plan view, the second sub-pixel group comprising a second-first sub-pixel and a second-second sub-pixel;

a third sub-pixel group on the substrate and arranged along a third imaginary line parallel to the second imaginary line in a plan view, a portion of the third imaginary line being arranged in the component area in a plan view and the second imaginary line being between the first imaginary line and the third imaginary line in a plan view;

a sixth sub-pixel group on the substrate and arranged along a sixth imaginary line parallel to the first imaginary line in a plan view;

a data driver arranged in the peripheral area and configured to output a dataset comprising one of a first color data signal or a second color data signal;

a data distributor configured to transmit the dataset received from the data driver to the first sub-pixel group, the second sub-pixel group, and the third sub-pixel group;

a first data line configured to connect the data distributor to the first sub-pixel group;

a second data line configured to connect the data distributor to the second sub-pixel group;

a third data line configured to connect the data distributor to the third sub-pixel group, and a sixth data line configured to connect the data distributor to the sixth sub-pixel group, wherein the data distributor is further configured to:

alternately transmit the first color data signal to the first data line and the third data line;

electrically connect the sixth data line to corresponding output line based on a second control signal, and wherein a position of the second-first sub-pixel and a position of the second-second sub-pixel are symmetrical with each other with respect to an imaginary center line that passes through a center of the component area in a plan view and crosses the first to third imaginary lines.

* * * * *